(12) United States Patent
Kwon et al.

(10) Patent No.: US 11,652,130 B2
(45) Date of Patent: May 16, 2023

(54) IMAGE SENSOR AND MANUFACTURING METHOD OF THE SAME

(71) Applicant: Samsung Electronics Co., Ltd., Suwon-si (KR)

(72) Inventors: Doowon Kwon, Seongnam-si (KR); Ingyu Baek, Seoul (KR)

(73) Assignee: Samsung Electronics Co., Ltd.

( * ) Notice: Subject to any disclaimer, the term of this patent is extended or adjusted under 35 U.S.C. 154(b) by 119 days.

(21) Appl. No.: 16/898,212

(22) Filed: Jun. 10, 2020

(65) Prior Publication Data
US 2021/0134873 A1 May 6, 2021

(30) Foreign Application Priority Data

Nov. 6, 2019 (KR) .................. 10-2019-0141207

(51) Int. Cl.
*H01L 27/146* (2006.01)
(52) U.S. Cl.
CPC .. *H01L 27/14643* (2013.01); *H01L 27/14609* (2013.01); *H01L 27/14634* (2013.01); *H01L 27/14636* (2013.01)
(58) Field of Classification Search
None
See application file for complete search history.

(56) References Cited

U.S. PATENT DOCUMENTS

| | | | |
|---|---|---|---|
| 10,090,342 B1 | 10/2018 | Gambino et al. | |
| 10,116,891 B2 | 10/2018 | Raynor | |
| 10,186,535 B2 | 1/2019 | Hynecek et al. | |
| 2014/0042298 A1 | 2/2014 | Wan et al. | |
| 2015/0115389 A1 | 4/2015 | Chuang et al. | |
| 2016/0020235 A1* | 1/2016 | Yamashita | H01L 27/14641 250/206 |
| 2017/0092680 A1* | 3/2017 | Kwon | H01L 27/1462 |
| 2017/0345854 A1* | 11/2017 | Kwon | H01L 27/14603 |
| 2018/0103226 A1* | 4/2018 | Raynor | H04N 5/378 |
| 2018/0122850 A1 | 5/2018 | Umebayashi et al. | |
| 2018/0227549 A1* | 8/2018 | Cai | H01L 27/1464 |
| 2019/0053406 A1* | 2/2019 | Tezuka | H04N 5/3577 |
| 2019/0123088 A1 | 4/2019 | Kwon | |
| 2019/0363130 A1 | 11/2019 | Yokoyama et al. | |
| 2019/0386052 A1 | 12/2019 | Furuhashi | |

FOREIGN PATENT DOCUMENTS

| | | |
|---|---|---|
| JP | 2018-101699 A | 6/2018 |
| JP | 2018-129374 A | 8/2018 |

* cited by examiner

*Primary Examiner* — Khaja Ahmad
(74) *Attorney, Agent, or Firm* — Myers Bigel, P.A.

(57) ABSTRACT

An image sensor includes a first layer including pixels in a pixel array, and a first logic circuit configured to control the pixel array. Each of the pixels include at least one photodiode configured to generate a charge in response to light, and a pixel circuit configured to generate a pixel signal corresponding to the charge. A second layer includes a second logic circuit that is connected to the pixel array and the first logic circuit and is on the first layer. A third layer includes storage elements that are electrically connected to at least one of the pixels or the first logic circuit and an insulating layer on the storage elements. A lower surface of the insulating layer is attached to an upper portion of the first layer, and an upper surface of the insulating layer is attached to a lower portion of the second layer.

20 Claims, 28 Drawing Sheets

IMAGE SENSOR AND MANUFACTURING METHOD OF THE SAME

CROSS-REFERENCE TO RELATED APPLICATION(S)

This application claims benefit of priority to Korean Patent Application No. 10-2019-0141207 filed on Nov. 6, 2019 in the Korean Intellectual Property Office, the disclosure of which is incorporated herein by reference in its entirety.

FIELD

The present inventive concepts relate to an image sensor and a method of manufacturing the same.

BACKGROUND

Image sensors are semiconductor-based devices that can receive light and generate electrical signals therefrom. Image sensors may include a pixel array having a plurality of pixels, a logic circuit for driving the pixel array and generating an image, and the like. The plurality of pixels may include a photodiode that generates a charge in response to light, and a pixel circuit that outputs a pixel signal using the charge generated by the photodiode. In order to improve performance of image sensors, research into image sensors in which various elements are added is being conducted.

SUMMARY

An aspect of the present inventive concept is to provide an image sensor in which a pixel array, a logic circuit, and storage devices are formed in separate layers that are stacked on each other, in which a semiconductor substrate is removed from a layer disposed in the middle of the stack, and which is capable of simplifying a manufacturing process and implementing a global shutter operation and a High Dynamic Range (HDR) function.

According to an aspect of the present inventive concept, an image sensor includes a first layer including pixels arranged in a pixel array, and a first logic circuit configured to control the pixel array. Each of the pixels includes at least one photodiode configured to generate a charge in response to light, and a pixel circuit configured to generate a pixel signal corresponding to the charge. The image sensor further includes a second layer including a second logic circuit connected to the pixel array and the first logic circuit, where the second layer is on the first layer, a third layer including storage elements electrically connected to at least one of the pixels or the first logic circuit, and an insulating layer including the storage elements therein. A lower surface of the insulating layer is attached to an upper portion of the first layer, and an upper surface of the insulating layer is attached to a lower portion of the second layer.

According to an aspect of the present inventive concept, an image sensor includes a pixel array including pixels in a first semiconductor substrate, each of the pixels including a photodiode configured to generate a charge in response to light and a pixel circuit configured to generate a pixel voltage based on the charge; a first logic circuit including first elements in the first semiconductor substrate, where the first logic circuit is configured to control the pixels and is in or covered by a first insulating layer on the first semiconductor substrate; a second logic circuit including second elements in a second semiconductor substrate that is different from the first semiconductor substrate, where the second logic circuit is configured to drive the pixel array and the first logic circuit and is in or covered by a second insulating layer on the second semiconductor substrate; and capacitors between the first insulating layer and the second insulating layer, where the capacitors are in a third insulating layer that is different from the first insulating layer and the second insulating layer, and are connected to at least one of the pixel array or the first logic circuit.

According to an aspect of the present inventive concept, an image sensor includes a first layer including a first semiconductor substrate, a pixel array in a first region of the first semiconductor substrate, and a first logic circuit in a second region around the first region and configured to drive the pixel array; a second layer stacked on the first layer in a direction perpendicular to an upper surface of the first semiconductor substrate, the second layer including a second semiconductor substrate and a second logic circuit on the second semiconductor substrate; a third layer between the first layer and the second layer and including storage elements; and logic vias extending through the third layer and connecting the first logic circuit to the second logic circuit, where the logic vias do not extend through a semiconductor material in the third layer.

According to an aspect of the present inventive concept, a method of manufacturing an image sensor includes forming a first layer including a first semiconductor substrate, a pixel array and a first logic circuit on the first semiconductor substrate, and a first insulating layer on the pixel array and the first logic circuit; forming a second layer including a second semiconductor substrate that is different from the first semiconductor substrate, a second logic circuit on the second semiconductor substrate and different from the first logic circuit, and a second insulating layer on the second logic circuit; forming a third layer including a third semiconductor substrate that is different from the first semiconductor substrate and the second semiconductor substrate, storage elements on the third semiconductor substrate, and a third insulating layer on the storage elements; attaching the first layer to the third layer such that a first surface of the third insulating layer faces the first insulating layer; removing the third semiconductor substrate to expose a second surface of the third insulating layer; and attaching the third layer to the second layer such that the second surface of the third insulating layer faces the second insulating layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
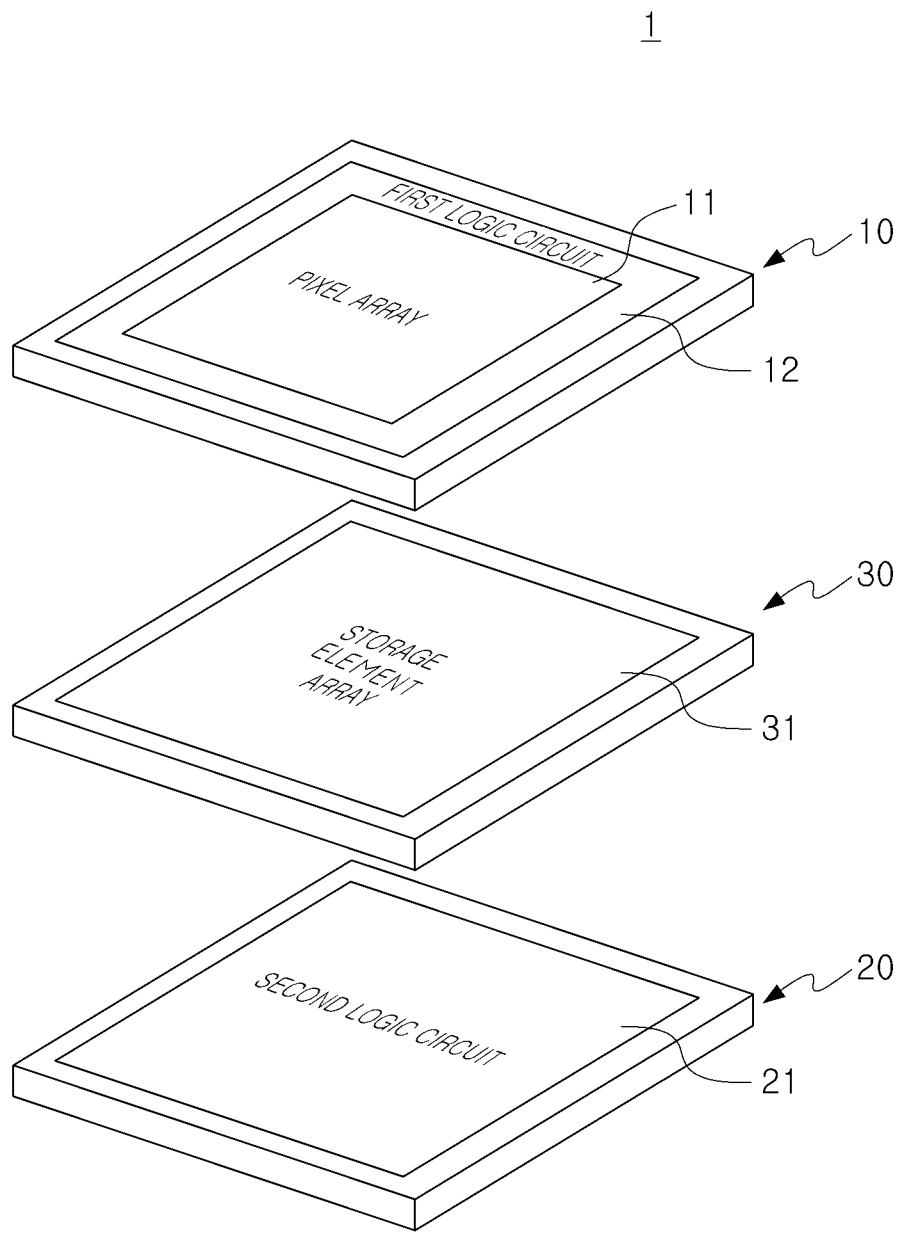
FIGS. 1 to 3 are schematic diagrams illustrating an image sensor according to an example embodiment of the present disclosure.

Hereinafter, the example embodiments of the present disclosure will be described in detail with reference to the attached drawings. The same reference numerals are used for the same constituent elements in the drawings, and a duplicate description of the same constituent elements will be omitted.

Figure 2:
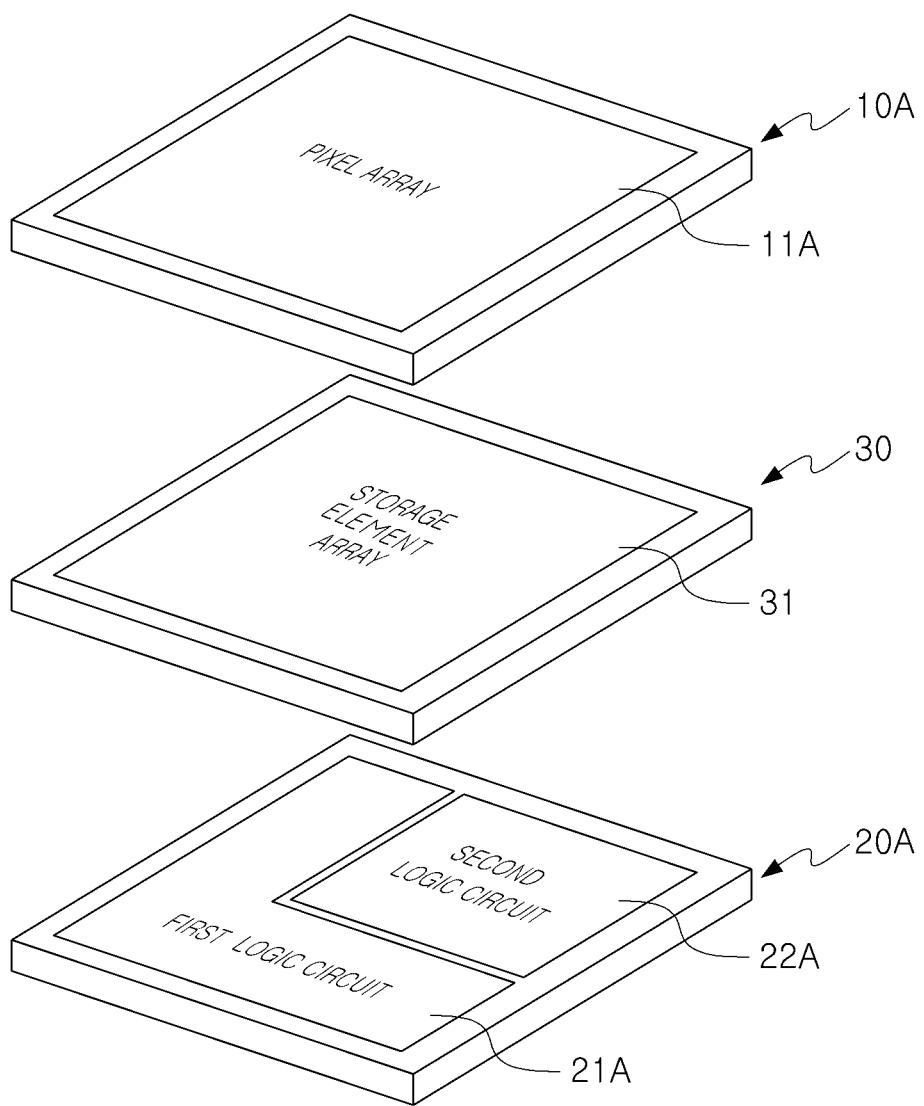
Figure 3:
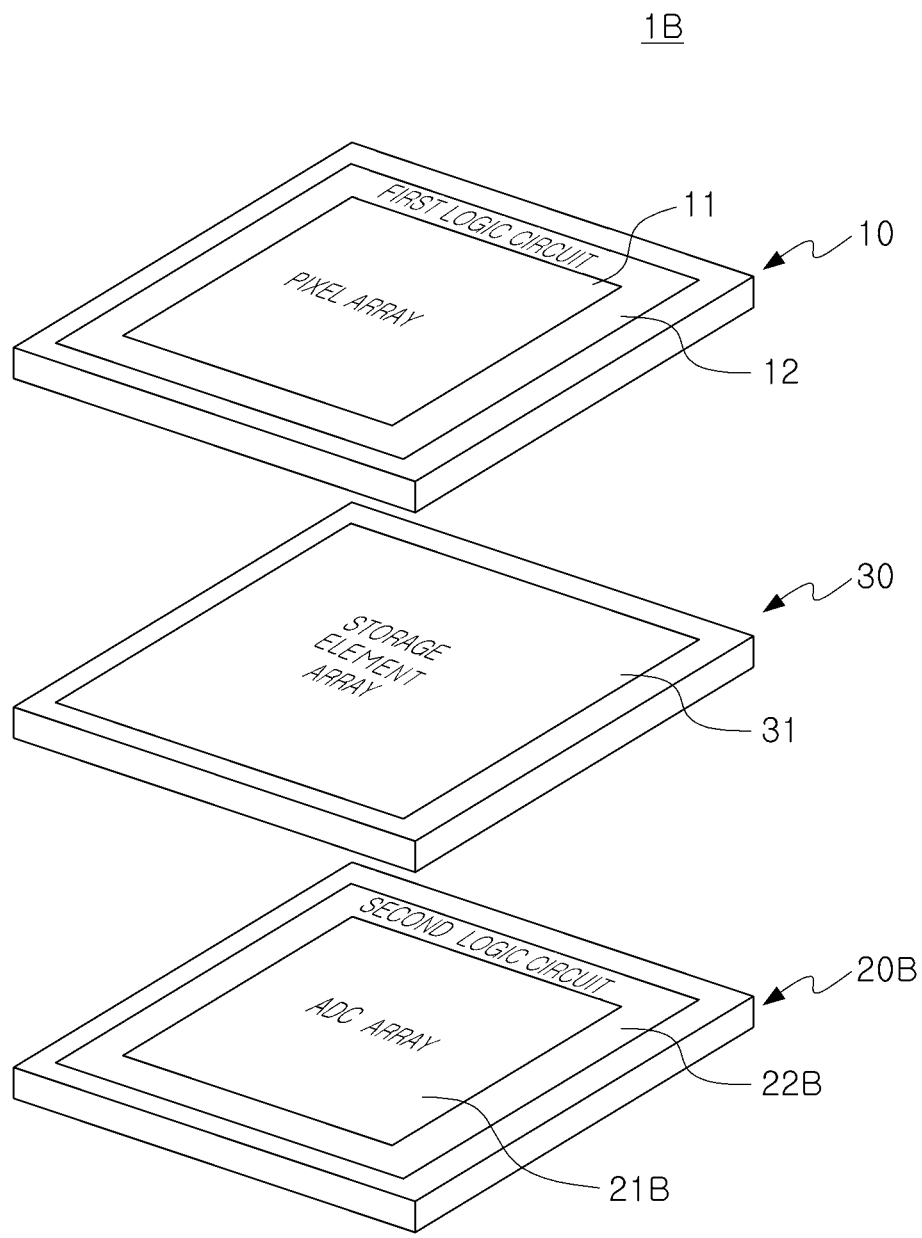

FIGS. 1 to 3 are schematic diagrams illustrating an image sensor according to an example embodiment of the present disclosure.

First, referring to FIG. 1, an image sensor 1 according to an example embodiment of the present disclosure includes first, second, and third layers 10, 20, and 30. The first to third layers 10, 20, and 30 may be stacked in a vertical direction. For example, the third layer 30 may be disposed between the first layer 10 and the second layer 20. The terms first, second, third, etc. are used herein merely to distinguish one element or layer from another element or layer.

For example, the first layer 10 may include a pixel array 11 and a first logic circuit 12. The pixel array 11 includes a plurality of pixels, and the pixels are connected to row lines extended in a first direction and column lines extended in a second direction, intersecting the first direction and may be arranged in a matrix form. Each of the pixels may include at least one photodiode that generates a charge in response to light, and a pixel circuit that generates a pixel voltage using the charge generated by the photodiode.

The first logic circuit 12 may include circuits for driving a pixel array. In an example, the first logic circuit 12 may include a row driver that drives row lines, a read-out circuit that acquires a pixel voltage from pixels through column lines, a control logic that controls a row driver and a read-out circuit, and the like. In an embodiment, the pixel array 11 is disposed in a first region of the first layer 10, while the first logic circuit 12 is disposed in a second region around the first region.

The second layer 20 may include a second logic circuit 21. The second logic circuit 21 may include circuits for driving the pixel array 11 and the first logic circuit 12. In an example, the second logic circuit 21 may include a power circuit, an input/output interface, an image signal processor, and the like.

The third layer 30 may include a storage element array 31. The storage element array 31 may include storage elements, and the storage elements may be implemented as at least one of a Metal-Insulator-Metal (MIM) capacitor, a charge trap element, a Magnetic Tunnel Junction (MTJ) element, or a germanium (Ge)-antimony (Sb)-tellurium (Te) (GST) element. The storage elements may be connected to pixels formed in the first layer 10 and/or the first logic circuit 12. Moreover, the storage elements may be connected to the second logic circuit 21 formed in the second layer 20.

Next, referring to FIG. 2, an image sensor 1A according to an example embodiment of the present disclosure may include first, second, and third layers 10A, 20A, and 30 stacked in a vertical direction.

In an example embodiment illustrated in FIG. 2, the first layer 10A may include a pixel array 11A, and all of a first logic circuit 21A and a second logic circuit 22A may be disposed in the second layer 20A. The first logic circuit 21A may include a row driver, a read-out circuit, a control logic, and the like, and the second logic circuit 22A may include a power circuit, an input/output interface, an image signal processor, and the like. The third array 30 may include a storage element array 31 in which storage elements are disposed.

An image sensor 1B according to an example embodiment illustrated in FIG. 3 may include first, second, and third layers 10, 20B, and 30 stacked in a vertical direction. The first layer 10 and the third layer 30 may be the same as those of the image sensor 1 according to an example embodiment illustrated in FIG. 1.

In an example embodiment illustrated in FIG. 3, a second layer 20B may include analog-to-digital converters (ADC). The analog-to-digital converters may be disposed in an ADC array 21B, and the second logic circuit 22B may be disposed around the ADC array 21B.

In an example, a region of the second layer 20B, in which the ADC array 21B is disposed, may correspond to a region of the first layer 10 in which the pixel array 11 is disposed. In other words, the ADC array 21B may be disposed in a lower portion of the pixel array 11. In an example embodiment, pixels of the pixel array 11 may be connected to the analog-to-digital converters of the ADC array 21B through storage elements of the storage element array 31. A pixel signal, output to or from the pixels, may be an analog signal, and the analog-to-digital converters may output the pixel signal by converting the analog signal into a digital pixel signal.

Figure 4:
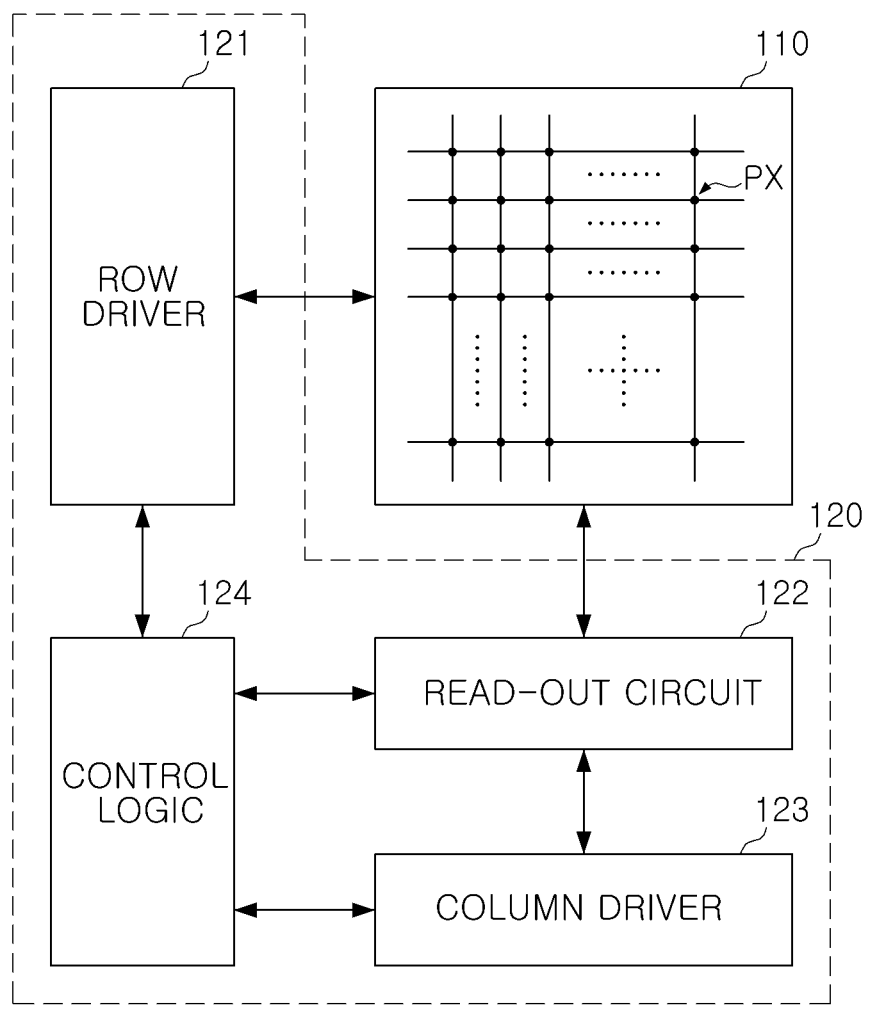
FIG. 4 is a schematic block diagram illustrating an image sensor according to an example embodiment of the present disclosure.

FIG. 4 is a schematic block diagram illustrating an image sensor according to an example embodiment of the present disclosure.

Referring to FIG. 4, an image sensor 100 may include a pixel array 110, a logic circuit 120, and the like.

The pixel array 110 may include a plurality of pixels PX arranged in the form of an array along a plurality of rows and a plurality of columns. Each of the plurality of pixels PX may include at least one photodiode that generates a charge in response to light, a pixel circuit that generates a pixel signal corresponding to the charge generated by the photodiode, and the like. In an example, the pixel circuit may include a floating diffusion, a transfer transistor, a reset transistor, a driving transistor, a select transistor, and the like. According to example embodiments, a configuration of the pixels PX may vary. In an example, each of the pixels PX may include an organic photodiode including an organic material, or may be implemented as a digital pixel. When the pixels PX are implemented as the digital pixel, each of the pixels PX may include an analog-to-digital converter for outputting a digital pixel signal. That is, each pixel PX may include at least one photodiode and additional circuitry.

The logic circuit 120 may include circuits for controlling the pixel array 110. In an example, the logic circuit 120 may include a row driver 121, a read-out circuit 122, a column driver 123, a control logic 124, and the like. The row driver 121 may drive the pixel array 110 in the unit of row (ROW) lines. For example, the row driver 121 may generate a transmission control signal that controls the transfer transistor of a pixel circuit, a reset control signal that controls the reset transistor thereof, a select control signal that controls the select transistor thereof, and may input the same to the pixel array 110.

The read-out circuit 122 may include a correlated double sampler (CDS), an analog-to-digital converter (ADC), and the like. The correlated double samplers may be connected to the pixels PX through the column lines. The correlated double samplers may read a pixel signal through the column lines, from the pixels PX connected to a row line selected by a row line select signal of the row driver 121. The analog-to-digital converter may convert the pixel signal, detected by the correlated double sampler, into a digital pixel signal, and may transmit the digital pixel signal to the column driver 123.

The column driver 123 may include a latch for temporarily storing a digital pixel signal, a buffer circuit, an amplification circuit, or the like, and may process the digital pixel signal received by the read-out circuit 122. The row driver 121, the read-out circuit 122, and the column driver 123 may be controlled by the control logic 124. The control logic 124 may include a timing controller for controlling operation timing of the row driver 121, the read-out circuit 122, and the column driver 123.

Figure 5:
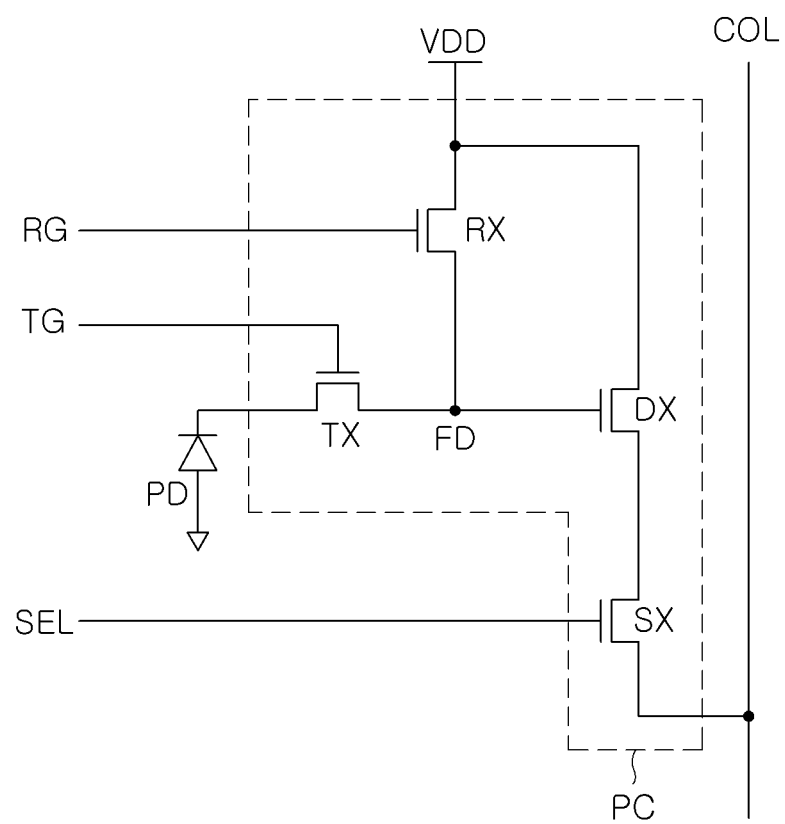
FIG. 5 is a schematic circuit diagram illustrating a pixel circuit of an image sensor according to an example embodiment of the present disclosure.

FIG. 5 is a schematic circuit diagram illustrating a pixel circuit of an image sensor according to an example embodiment of the present disclosure.

Referring to FIG. 5, a pixel according to an example embodiment of the present disclosure may include a pixel circuit PC having a plurality of transistors and a photodiode PD. The signal, generated by the transistors using the charge generated by the photodiode PD, may be output through a column line COL.

The pixel circuit PC may include a transfer transistor TX, a reset transistor RX, a driving transistor DX, a select transistor SX, and the like. The reset transistor RX may be turned-on and turned-off by the reset control signal RG. When the reset transistor RX is turned-on, a voltage of the floating diffusion FD may be reset as a power voltage VDD. In an example, when the voltage of the floating diffusion FD is reset, the select transistor SX is turned-on by the select control signal SG, so the reset voltage may be output to the column line COL.

In an example embodiment, the photodiode PD generates an electron or a hole as a main charge carrier, in response to light. When the reset voltage is output to the column line COL and then the transfer transistor TX is turned-on, the charge, generated due to exposure of the photodiode PD to light, may move to the floating diffusion FD. The driving transistor DX may be operated as a source-follower amplifier amplifying a voltage of the floating diffusion FD. When the select transistor SX is turned-on by the select control signal SG, a pixel voltage corresponding to the charge generated by the photodiode PD may be output to the column line COL.

Figure 6:
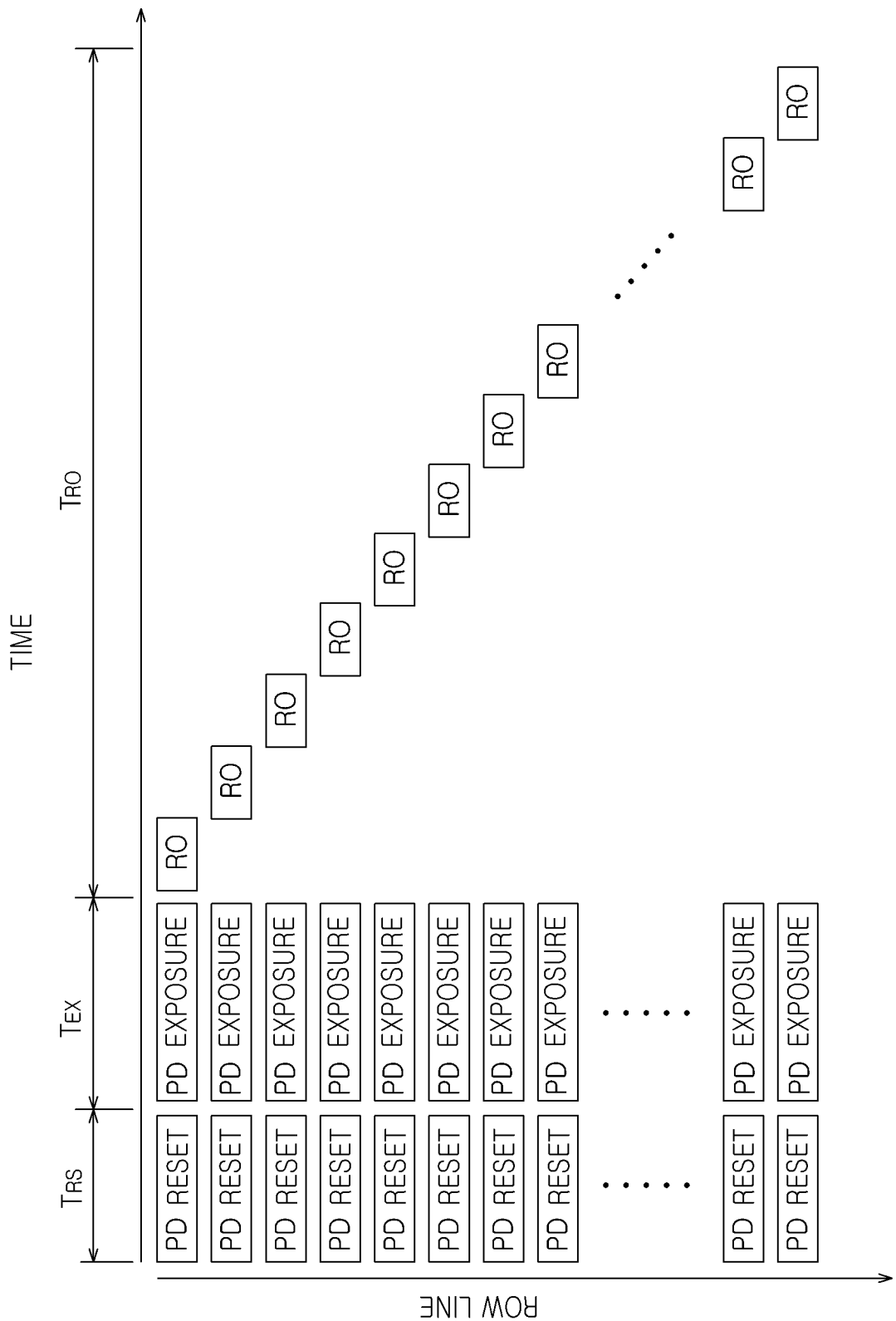
FIG. 6 is a diagram illustrating an operation of an image sensor according to an example embodiment of the present disclosure.

FIG. 6 is a diagram illustrating an operation of an image sensor according to an example embodiment of the present disclosure.

For convenience of explanation, an operation of an image sensor 100 will hereinafter be described together with reference to FIG. 4. In an example embodiment illustrated in FIG. 6, the image sensor 100 may be operated in a global shutter method, in which pixels PX are simultaneously reset and simultaneously exposed to light (e.g., simultaneously active to generate a charge responsive to light incident thereon).

Referring to FIG. 6, during the reset time $T_{RS}$, photodiodes of pixels PX included in the pixel array 110 may be simultaneously reset. In an example, a reset transistor, included in a pixel circuit, is turned-on to connect a photodiode to a predetermined power supply voltage, so the photodiode may be reset.

When or after the photodiodes are reset, the photodiodes, included in the pixels PX, are active and exposed to light during the exposure time $T_{EX}$, so a charge may be generated. In an example, the exposure time $T_{EX}$) may be determined by an operating environment of the image sensor, a shutter speed, an aperture value, and the like.

When or after the exposure time $T_{EX}$ elapses, the row driver 121 may scan each of row lines. The read-out circuit 122 may execute a read-out operation for each of the pixels PX in the order in which the row driver 121 scans the row lines. The read-out circuit 122 may read a pixel signal from each of a plurality of pixels PX during the read-out time $T_{RO}$.

The read-out circuit 122 may read a pixel signal of the pixels PX in the unit of a row lines. Thus, pixels PX, connected to a row line which is not activated by the row driver 121, may store the charge generated by the photodiodes. Alternatively, the charge may be stored until the pixel signal generated by the pixels PX is output through the column lines. Thus, in order for the image sensor 100 to be operated in a global shutter method, a device for storing a charge generated by a photodiode, and/or a pixel signal generated by a pixel circuit may be required.

Figure 7:
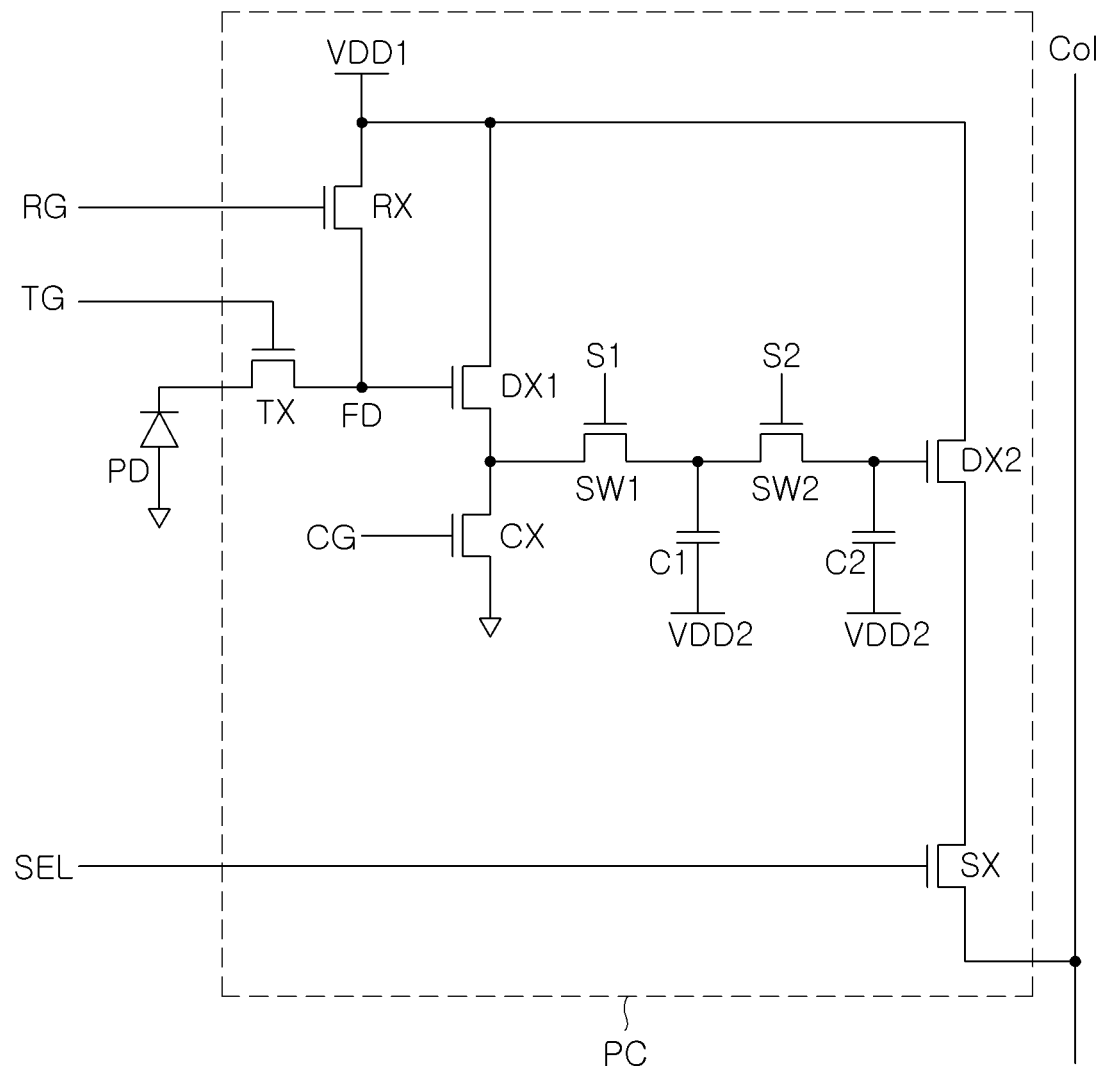
FIGS. 7 and 8 are schematic circuit diagrams illustrating pixel circuits of an image sensor according to an example embodiment of the present disclosure.
Figure 8:
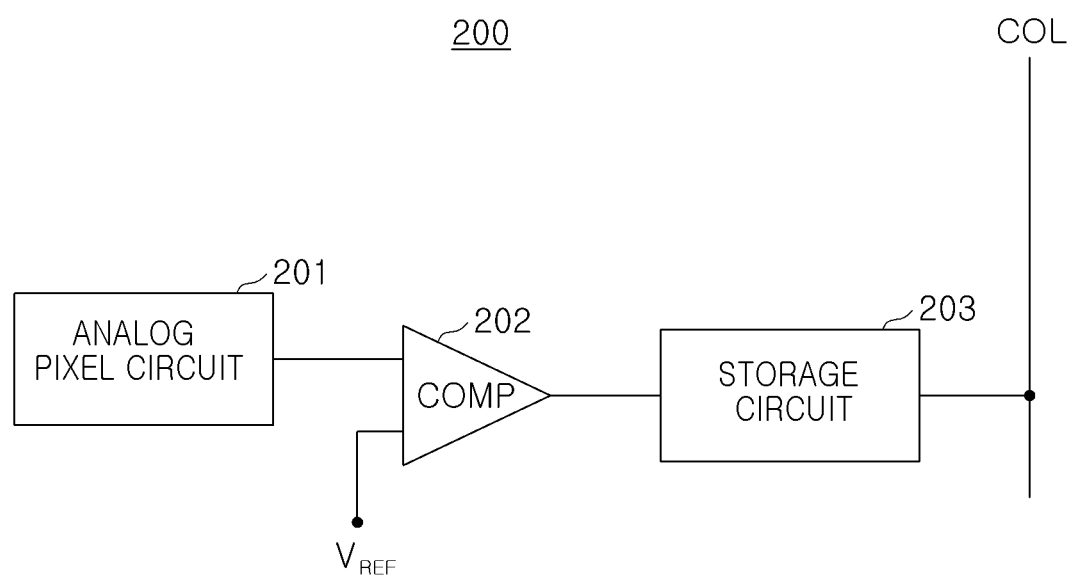

FIGS. 7 and 8 are schematic circuit diagrams illustrating pixel circuits of an image sensor according to an example embodiment of the present disclosure.

In an example, FIGS. 7 and 8 are circuit diagrams illustrating pixel circuits of an image sensor operated in a global shutter method. Referring to FIGS. 7 and 8, a pixel of an image sensor according to an example embodiment of the present disclosure may include a photodiode PD and a pixel circuit PC.

First, in an example embodiment illustrated in FIG. 7, the pixel circuit PC may include a transfer transistor TX, a reset transistor RX, a first driving transistor DX1, a first switch element SW1, a second switch element SW2, a second driving transistor DX2, a select transistor SX, a current source transistor CX, and the like. Moreover, the pixel circuit PC may include at least one storage element C1 and C2.

As described previously with reference to FIG. 6, in an image sensor operated in a global shutter method, pixels may be simultaneously reset. In a reset operation, a reset transistor RX is turned-on by a reset control signal RG during the reset time $T_{RS}$, so a charge of a floating diffusion FD may be removed. Then, a charge may be generated by a photodiode PD responsive to exposure to light during the exposure time $T_{EX}$.

In an operation of a global shutter method, pixels are simultaneously reset and are simultaneously active and exposed to light. Moreover, a read-out operation for reading a pixel signal from pixels may be executed sequentially in the unit of row lines connected to the pixels. Thus, at least a portion of pixels may store a charge generated by the photodiode PD and/or a pixel signal corresponding to the charge generated by the photodiode PD, until the read-out operation is executed. In an example embodiment illustrated in FIG. 7, when the transfer transistor TX is turned-on by the transfer control signal TG and a charge generated by the photodiode PD moves to the floating diffusion FD, a first driving transistor DX1, operated as a source-follower amplifier, may output a first pixel signal. Due to the current control signal CG, the current source transistor CX may supply a current to the first driving transistor DX1.

As at least one of the first switch element SW1 and a second switch element SW2 is turned-on, the first pixel signal may be stored in at least one of the first capacitor C1 and the second capacitor C2. That is, the first capacitor C1 and the second capacitor C2, provided as storage elements, may be programmed by the first pixel signal output by the first driving transistor DX1.

In at least a portion of pixels, before the read-out operation is executed, at least one of the first switch element SW1 and the second switch element SW2 is turned-on by the first control signal S1 and the second control signal S2, and the first pixel signal may be stored in the first capacitor C1 and/or the second capacitor C2. When the read-out operation is executed, the second switch element SW2 and the select transistor SX are turned-on, and the second driving transistor DX2 may amplify a first pixel signal to output a second pixel signal. The second pixel signal may be a pixel signal output by a pixel to a read-out circuit through the column line COL.

Next, in an example embodiment illustrated in FIG. 8, a pixel 200 may include an analog pixel circuit 201, a comparator 202, a storage circuit 203, and the like. The analog pixel circuit 201 may include a photodiode and two or more transistors, and may output a pixel signal corresponding to the charge generated by a photodiode responsive to exposure to light.

The comparator 202 compares the pixel signal with a predetermined reference signal $V_{REF}$ to output a result thereof. In an example, when the magnitude relationship between the pixel signal and the reference signal $V_{REF}$ is changed, the comparator 202 may invert the output thereof. The storage circuit 203 may include a counter circuit, and the like. In an example embodiment, the storage circuit 203 may count the time until the output of the comparator is inverted, and a count result may be stored as a digital pixel signal. When a read-out operation for the pixel 200 starts, the storage circuit 203 may output the digital pixel signal to the column line COL.

In other words, the pixel 200 according to an example embodiment illustrated in FIG. 8 may output not an analog signal but a digital signal. Thus, noise in the read-out operation may be reduced, and a pixel signal is inverted into a digital pixel signal in the pixel 20, included in the image sensor, simultaneously, so the read-out speed may be improved.

However, there is a limitation in an area which each of pixels of an image sensor could have. Thus, an integration problem may occur in that, in a single pixel, capacitors C1 and C2 are disposed as illustrated in FIG. 7, or a comparator 202 and a storage circuit 203 are disposed as illustrated in FIG. 8. In an example embodiment of the present disclosure, at least a portion of elements included in a pixel are formed in wafers different from each other and the wafers are stacked, thereby connecting elements. Thus, an image sensor, operated in a global shutter method and solving an integration problem, may be provided.

Meanwhile, the capacitors C1 and C2 and the storage circuit 203 may be used for other functions other than an operation of a global shutter method. For example, the capacitors C1 and C2 and the storage circuit 203 may be used for a memory storing image data, or may be used for providing a High Dynamic Range (HDR) function.

In an example, first image data, generated by activation and exposure of the photodiode PD to light during a first time, may be stored in the capacitors C1 and C2 and/or the storage circuit 203. The photodiode PD may be activated and exposed to light during the second time different from the first time to generate second image data, and a resulting image may be generated using the first image data and the second image data. In an example embodiment, the first time may be longer in duration than the second time. In particular, in first image data that is acquired during a relatively long first time, a dark area may be sufficiently represented. In second image data that is acquired during a relatively short second time, a bright area may be accurately represented without saturation. The image signal processor, included in the image sensor, may generate a resulting image using both the first image data and the second image data. According to example embodiments, rather than the image data, the pixel signal generated in response to the charge generated due to activation and exposure of the photodiode PD to light in each of the first time and the second time may be stored in the capacitors C1 and C2 or the storage circuit 203.

Figure 9:
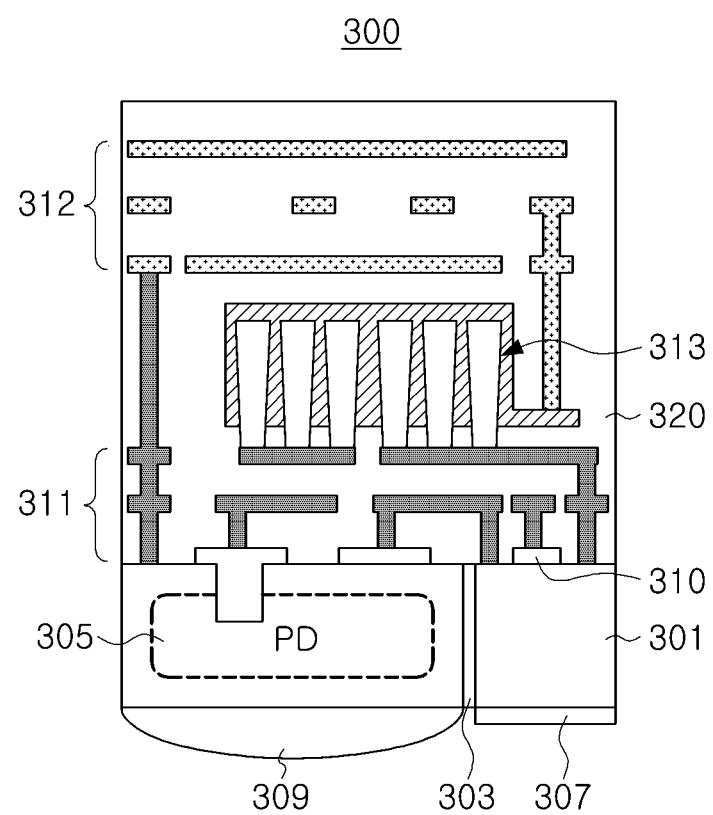
FIGS. 9 and 10 are diagrams illustrating an image sensor according to an example embodiment of the present disclosure.
Figure 10:
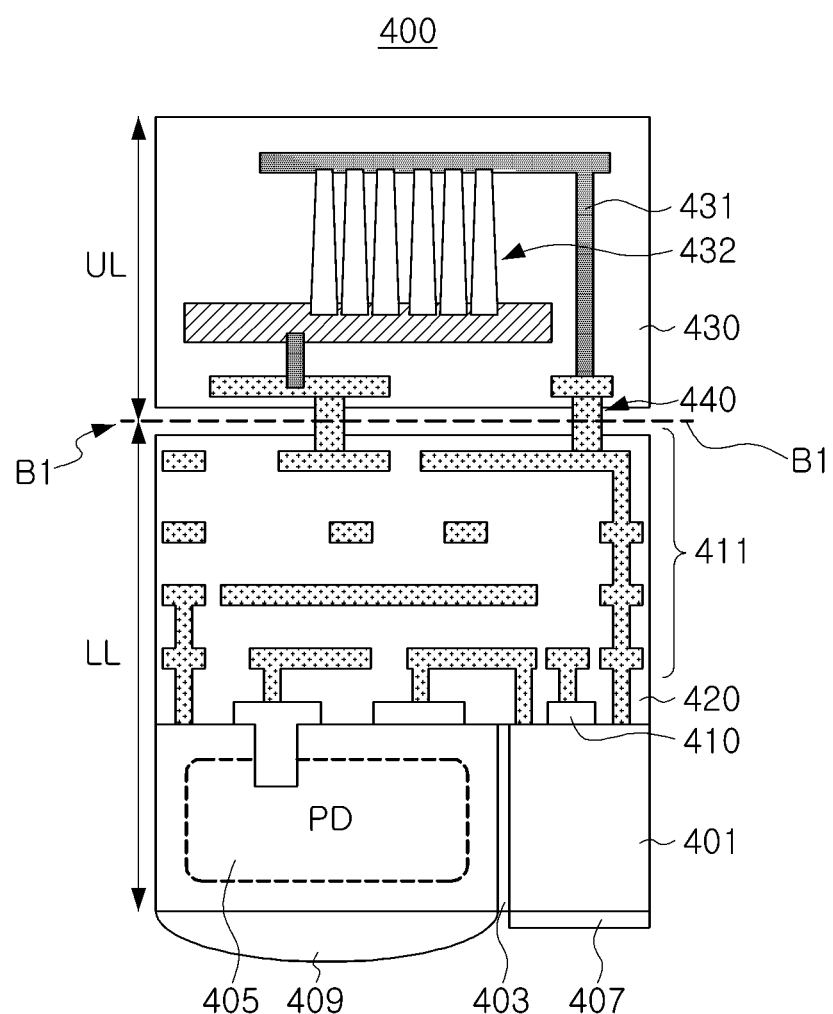

FIGS. 9 and 10 are diagrams illustrating an image sensor according to an example embodiment of the present disclosure.

FIGS. 9 and 10 are diagrams illustrating a cross-sectional structure of one of pixels included in image sensors 300 and 400. In particular, FIG. 9 illustrates a comparative example provided to describe an image sensor. Referring to FIG. 9, an image sensor 300 according to a comparative example may include a semiconductor substrate 301, a photodiode 305 and transistors 310, formed on the semiconductor substrate 301, metal wirings 311 and 312, connected to the transistors 310, an insulating layer 320 embedding the transistors 310 and the metal wirings 311 and 312, and the like.

The semiconductor substrate 301 may be a substrate including a semiconductor material such as silicon, and the photodiode 305 may be formed in the semiconductor substrate 301. In an example, the photodiode 305 may be formed using a process of injecting impurities into an interior of the semiconductor substrate 301, and the photodiode 305 may be connected to at least one of the transistors 310. Referring to FIG. 9, a vertical separation membrane 303 is formed adjacent to the photodiode 305, and the photodiode 305 may not be formed in or on one side of the vertical separation membrane 303, such that the substrate 301 is free of the photodiode on one side of the vertical separation 303.

On one surface of the semiconductor substrate 301, a light blocking layer 307 and a microlens 309 may be formed. In an example, the light blocking layer 307 may be formed in or on one side of the vertical separation membrane 303 not having the photodiode 305, and the microlens 309 may be formed to overlap the photodiode 305.

The transistors 310 may provide a pixel circuit. In an example, the transistors 310 may include a transfer transistor, a reset transistor, a driving transistor, a current source transistor, a switch element, and the like. The transistors 310 are connected to the photodiode 305, and may be connected to the storage elements 313 embedded in the insulating layer 320 through the metal wirings 311 and 312. In a comparative example, the storage elements 313 may be capacitors, and may be disposed between lower wirings 311 and upper wirings 312.

A process of manufacturing capacitors may include a process of forming a dielectric film. To improve leakage characteristics of capacitors, a process of forming a dielectric film may be performed at a relatively high temperature. When the dielectric film is formed at a high temperature, lower wirings 311, provided before formation of capacitors, may be formed of tungsten. However, tungsten has relatively high resistivity and low reflectance, as compared with other metals, for example, copper. In this regard, in a comparative example illustrated in FIG. 9, characteristics of the image sensor 300 may be lowered or worsened when the lower wirings 311 are formed of tungsten as compared with the case in which the lower wirings 311 are formed of other metals such as copper.

Referring to FIG. 10, in an example embodiment of the present disclosure, in order to solve the problem described above, storage elements 432 are separately formed to be attached to a pixel. The image sensor 400 according to an example embodiment of the present disclosure may include a lower layer LL including a photodiode 405 and transistors 410 and an upper layer UL including storage elements 432.

In an example, the photodiode 405, the transistors 410, the lower wirings 411, and the lower insulating layer 420 are formed in one semiconductor substrate 401 to manufacture the lower layer LL, while the upper wirings 431, the storage elements 432, and the upper insulating layer 430 are formed in another semiconductor substrate (different than the substrate 401 of the lower layer LL) to manufacture the upper layer UL. The upper layer UL may be vertically inverted to be attached to the lower layer LL. When the lower layer LL and the upper layer UL are attached to each other, a semiconductor substrate of or included in the upper layer UL and/or the lower layer LL, may be partially or completely removed therefrom.

At a boundary B1 between the lower layer LL and the upper layer UL, the lower insulating layer 420 and the upper insulating layer 430 face or oppose each other, and may be in contact with each other according to an example embodiment. At least one of the lower wirings 411 and at least one of the upper wirings 431 may be electrically connected to each other by copper-to-copper (Cu—Cu) bonding at a boundary B1 between the lower layer LL and the upper layer UL. As illustrated in FIG. 10, connection wirings 440 providing Cu—Cu bonding may be disposed at a boundary B1 between the lower layer LL and the upper layer UL.

In other words, in an example embodiment of the present disclosure, the storage elements 432 may be separately formed in a separate semiconductor substrate. Thus, since a high temperature process for formation of a dielectric film of the storage elements 432 may be performed without restriction (e.g., without concern as to effects of the high temperature process on existing wirings or other elements), a leakage current of the storage elements 432 can be significantly reduced. Moreover, since the lower wirings 411, connected to the transistors 410 of a pixel, are formed not of tungsten but of other metals (e.g., copper) having improved or excellent resistivity and reflectance, for example, copper, operation characteristics of the image sensor 400 may be improved.

FIGS. 11 to 15 are diagrams illustrating a vertical structure of an image sensor according to an example embodiment of the present disclosure.

Figure 11:
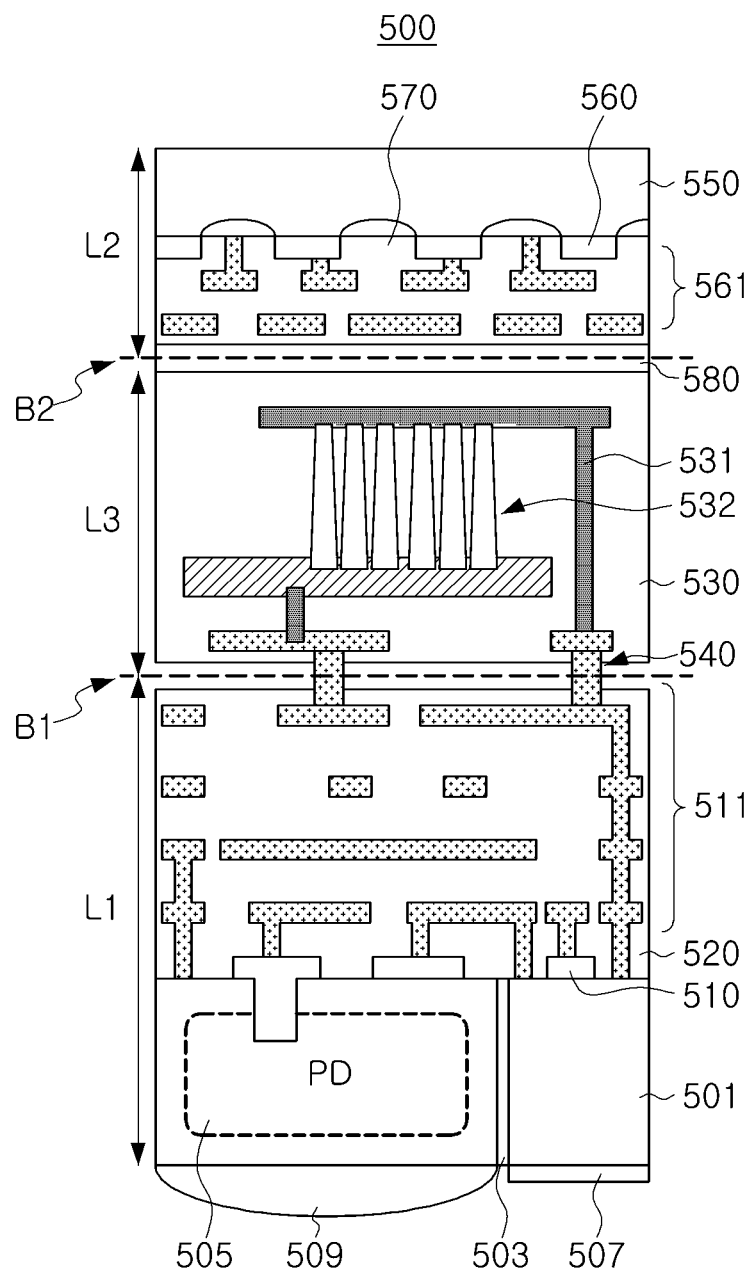
FIGS. 11 to 15 are diagrams illustrating a vertical structure of an image sensor according to an example embodiment of the present disclosure.
Figure 12:
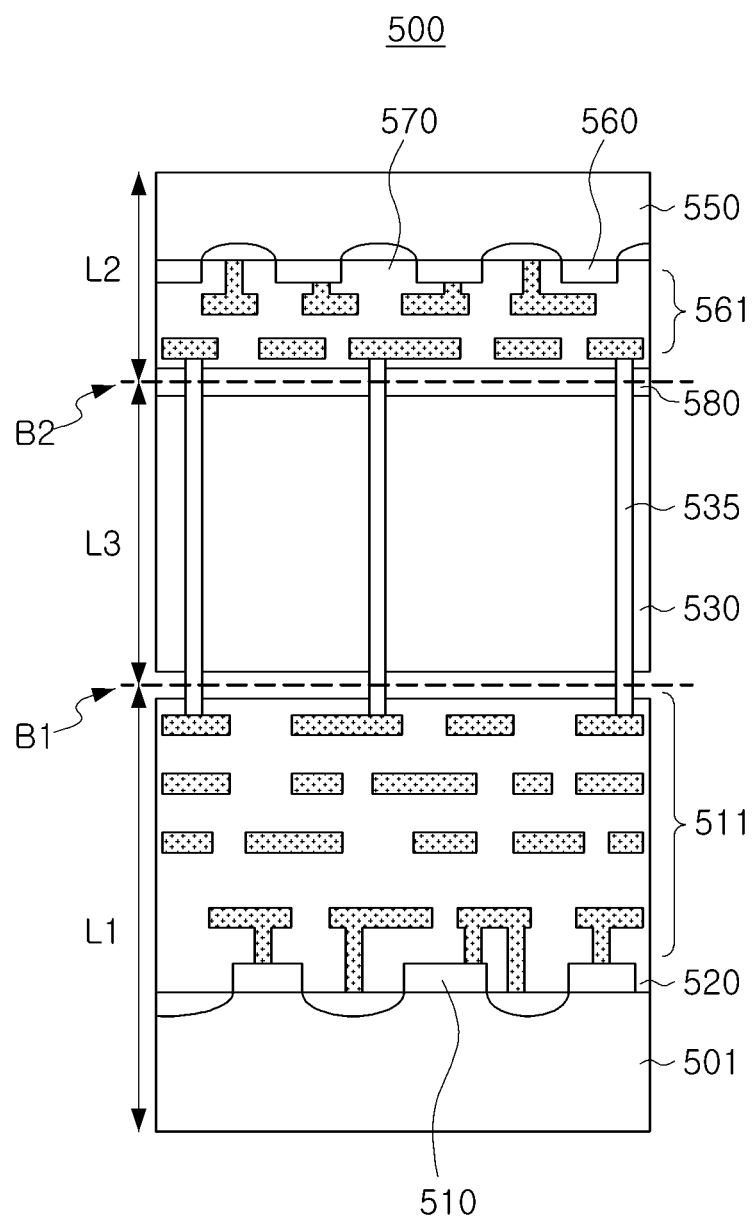

First, referring to FIGS. 11 and 12, an image sensor 500 according to an example embodiment of the present disclosure may include a first layer L1, a second layer L2, and a third layer L3. The third layer L3 may be disposed between the first layer L1 and the second layer L2.

The first layer L1 may include a pixel array having pixels, and a first logic circuit that controls the pixel array. In an example embodiment, the pixel array is disposed in a first region of the first layer L1, while the first logic circuit is disposed in a second region around the first region. The first logic circuit may include a row driver, a read-out circuit, a control logic, for driving a pixel array, and the like. In an example, FIG. 11 may be a diagram illustrating a cross-sectional structure of the first region of the image sensor 500, and FIG. 12 may be a diagram illustrating a cross-sectional structure of the second region of the image sensor 500.

Referring to the first layer L1, a vertical separation membrane 503 and a photodiode 505 are formed in the semiconductor substrate 501, and a light blocking layer 507 and a microlens 509 may be formed in one surface of the first semiconductor substrate 501. Moreover, transistors 510, included in a pixel circuit, may be formed in the first semiconductor substrate 501, and the transistors 510 and metal wirings 511, connected to the transistors 510, may be embedded in the insulating layer 520.

The second layer L2 may be disposed in an upper portion of the first layer L1 and may include a second logic circuit. The second logic circuit may include circuits for driving a pixel array and the first logic circuit. In an example, the second logic circuit may include a power circuit, an input/output interface, an image signal processor, and the like. Referring to the second layer L2, the second semiconductor substrate 550, circuit elements 560 formed on the second semiconductor substrate 550, metal wirings 561 connected to the circuit elements 560, an insulating layer 570 covering the circuit elements 560 and the metal wirings 561, and the like, may be included.

The third layer L3 may be disposed between the first layer L1 and the second layer L2. The third layer L3 may include storage elements 532 electrically connected to a pixel array of the first layer L1 and/or the first logic circuit, an insulating layer 530 embedding the storage elements 532, and the like. A lower surface of the insulating layer 530 is attached to the first layer L1, while an upper surface of the insulating layer 530 may be attached to the second layer L2. Moreover, the lower surface of the insulating layer 530 faces or opposes the upper surface of the insulating layer 520 of the first layer L1, while the upper surface of the insulating layer 530 may face or oppose the lower surface of the insulating layer 570 of the second layer L2.

In an example embodiment illustrated in FIG. 11, the storage elements 532 may be capacitors. In an example, the storage elements 532 may be implemented as Metal-Insulator-Metal (MIM) capacitors. In an example, each of pixels included in the first layer L1 may be connected to at least one of the storage devices 532. The pixels may not share the storage elements 532. In other words, the pixels may be connected to different storage elements 532, respectively.

When the storage elements 532 are implemented as capacitors, a first electrode of the capacitors may be connected to one of the first transistors 510. Referring to a circuit diagram illustrated in FIG. 7 described previously, by way of example, one of the first and second switch elements SW1 and SW2 may be connected to the first electrode of the capacitors. Moreover, the second electrode of the capacitors may be connected to a metal wiring, to which a predetermined power supply voltage is supplied, among the second metal wirings 511.

In other words, the storage elements 532 may provide the first capacitor C1 and the second capacitor C2 according to the circuit diagram illustrated in FIG. 7. Thus, the first pixel signal, output by the first driving transistor DX1, may be temporarily stored in the storage elements 532. When a read-out operation for a pixel starts, the second driving transistor DX2 may output the pixel signal to the column line COL using a voltage of the storage elements 532.

Cu—Cu bonding may be applied to a first boundary B1 between the first layer L1 and the third layer L3. Referring to FIG. 11, by connection wirings 540 disposed at the first boundary B1, at least one of the metal wirings 511 of the first layer L1 may be connected to at least one of the metal wirings 531 of the third layer L3.

In an example embodiment of the present disclosure, the third layer L3 and the second layer L2 may be directly attached to each other. Referring to FIGS. 11 and 12, an insulating layer 530 of the third layer L3 and an insulating layer 570 of the second layer L2 may be attached to each other by an adhesive layer 580.

An image sensor 500 according to an example embodiment of the present disclosure may include logic vias 535 passing through the third layer L3 and connecting the first logic circuit and the second logic circuit to each other. Referring to FIG. 12, a length of the logic vias 535 may be greater than a thickness of the third layer L3, and may be extended in a stacking direction from a second region in which a first logic circuit is disposed in the first layer L1. Connection wirings 540 connecting pixels to storage elements 532 may have a length shorter than logic vias 535.

The logic vias 535 may extend from the metal wirings 511 of the first layer L1 to the metal wirings 551 of the second layer L2, and may not pass through a region formed of a semiconductor material, for example, a semiconductor substrate. Referring to FIG. 12, logic vias 535 may extend into or pass through insulating layers 520, 530, and 570, of first to third layers L1 to L3, and an adhesive layer 580. Thus, the logic vias 535 need not be formed of a Through Silicon Via (TSV), and therefore process difficulty, time, and/or cost can be reduced.

Figure 13:
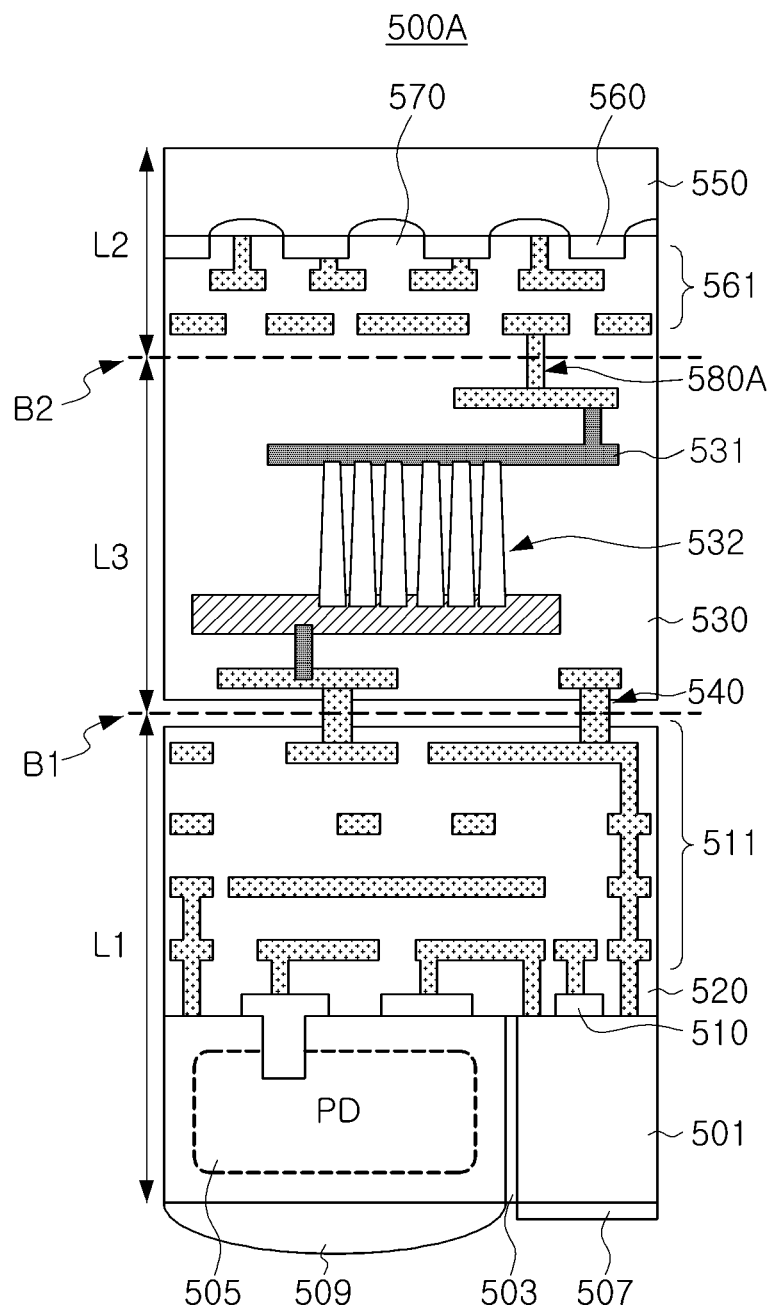

Next, referring to FIG. 13, an image sensor 500A according to an example embodiment of the present disclosure may include a first layer L1, a second layer L2, and a third layer L3 between the first layer L1 and the second layer L2. Hereinafter, a description of components similar to those of FIGS. 11 and 12 or those which may be understood with reference to FIGS. 11 and 12 will be omitted.

In an example embodiment illustrated in FIG. 13, the second layer L2 and the third layer L3 may be connected by a Cu—Cu bonding method. Referring to FIG. 13, metal wirings 561 of the second layer L2, and metal wirings 531 of the third layer L3 may be electrically connected to each other by connection wirings 580A. Thus, the second logic circuit of the second layer L2 may use the storage elements 532.

In an example, an image signal processor of the second logic circuit may store and process image data, received from the first logic circuit connected to the pixel array, in the storage elements 532. That is, the storage elements 532 may be used as a buffer memory for storing the image data. Alternatively, data for the operation of the second logic circuit may be stored in the storage elements 532.

Figure 14:
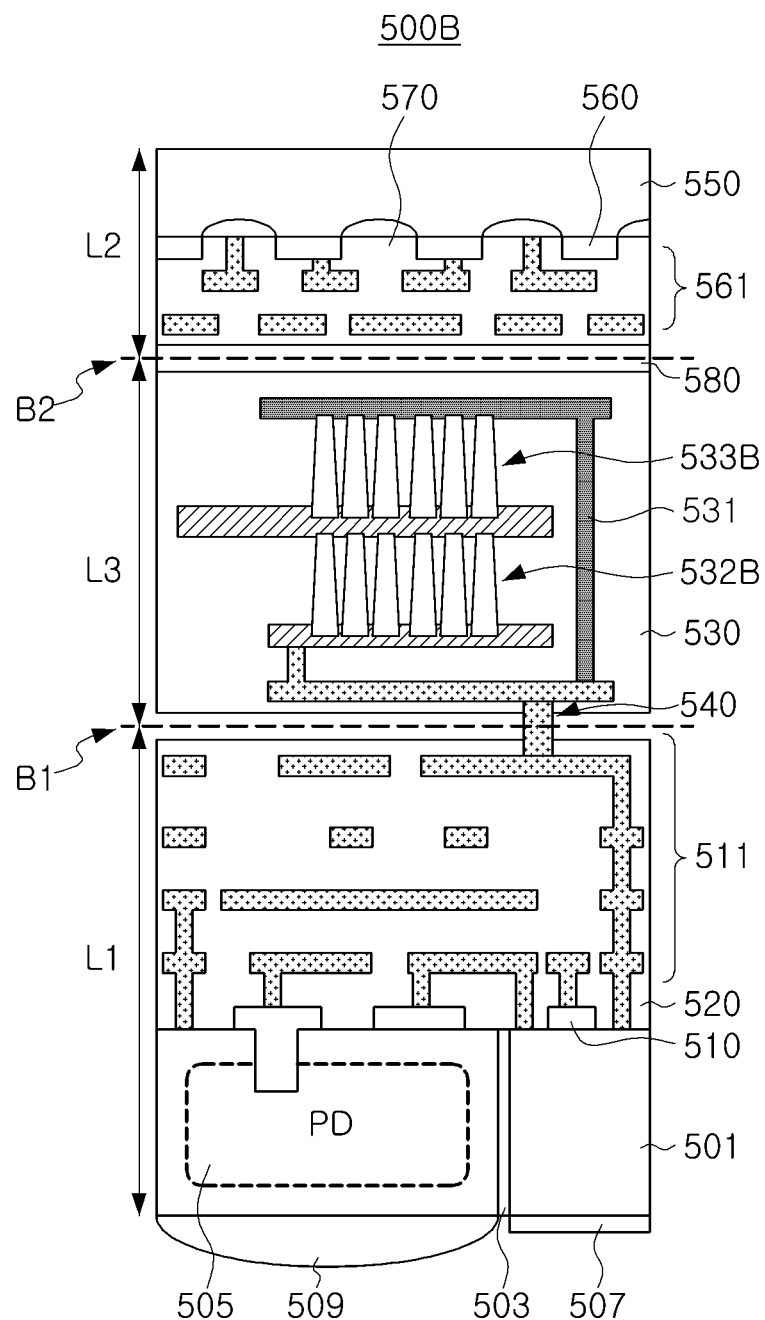

Next, referring to FIG. 14, an image sensor 500B according to an example embodiment of the present disclosure may include a first layer L1, a second layer L2, and a third layer L3 between the first layer L1 and the second layer L2. Hereinafter, similar to the description of FIG. 13, a description of components similar to those of FIGS. 11 and 12 or those which may be understood with reference to FIGS. 11 and 12 will be omitted.

In an example embodiment illustrated in FIG. 14, the storage elements 532B and 533B may be vertically stacked in the third layer L3. Referring to FIG. 14, the first storage elements 532B and the second storage elements 533B may be stacked inside the insulating layer 530 of the third layer L3. The first storage elements 532B and the second storage elements 533B may share at least a portion of the metal wirings 531 inside the insulating layer 530, and may be connected to the metal wirings 511 of the first layer L1 by the connection wirings 540.

In an example, the first storage elements 532B and the second storage devices 533B may be used for different purposes. The first storage elements 532B are connected to the first logic circuit of the first layer L1 to be used to store image data generated by processing a pixel signal by the first logic circuit. The second storage elements 533B are connected to pixels of the first layer L1 to store a charge generated by the photodiode 505 in each of the pixels, or may store a pixel signal output by the pixel circuit. The functions of the first storage elements 532B and the second storage elements 533B are not limited to those in the example embodiments, and may be variously expanded and/or changed.

Figure 15:
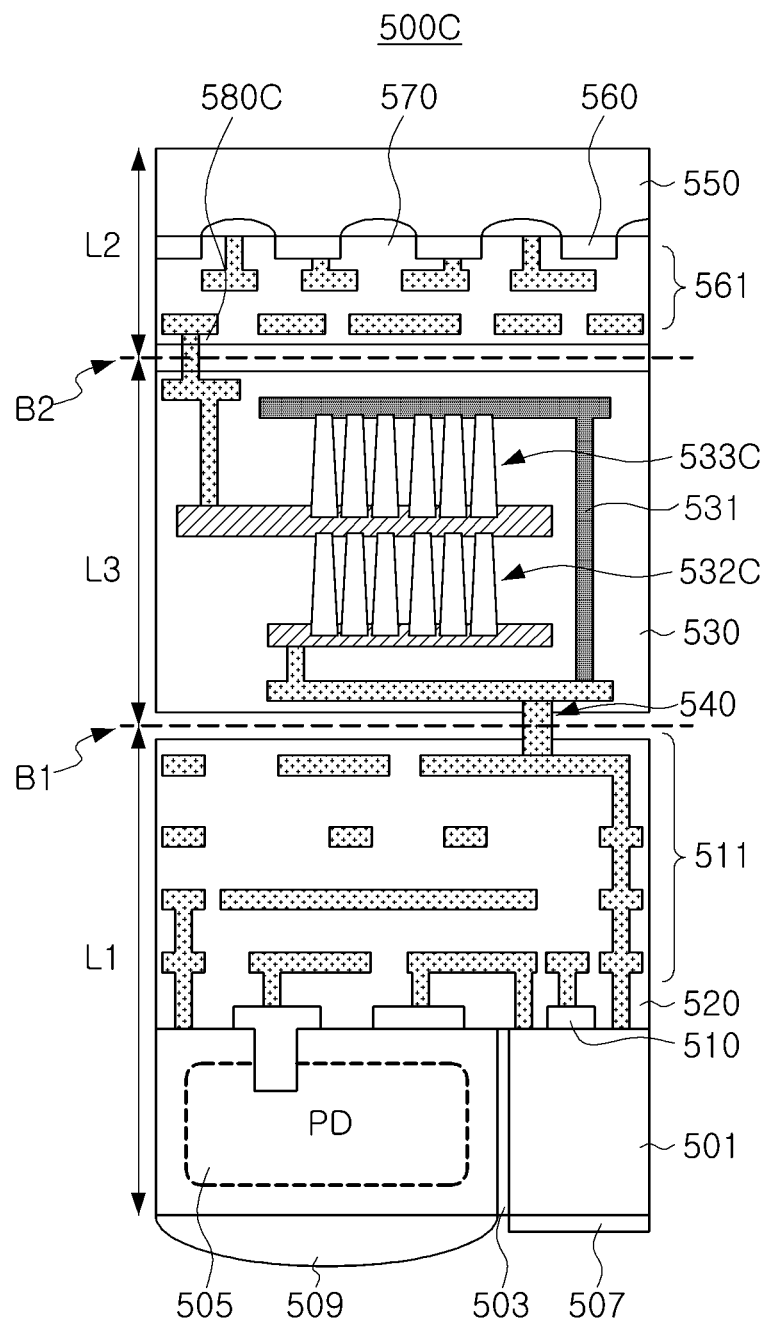

Next, referring to FIG. 15, an image sensor 500C according to an example embodiment of the present disclosure may include a first layer L1, a second layer L2, and a third layer L3 between the first layer L1 and the second layer L2. Hereinafter, similar to the descriptions of FIGS. 13 and 14, a description of components similar to those of FIGS. 11 and 12 or those which may be understood with reference to FIGS. 11 and 12 will be omitted.

In an example embodiment illustrated in FIG. 15, the storage elements 532C and 533C may be vertically stacked in the third layer L3. Moreover, the storage elements 532C and 533C may be connected not only to pixels and/or the first logic circuit, of the first layer L1, but also the second logic circuit of the second layer L2. Referring to FIG. 15, at least one of the metal wirings 531 connected to the storage elements 532C and 533C may be connected to at least one of the metal wirings 561 of the second layer L2 by the connection wirings 580C at a boundary B2 between the second layer L2 and the third layer L3.

In an example, the first storage elements 532C adjacent to the first layer L1 are connected to pixels of the first layer L1 to be used for a global shutter operation or a HDR function. Alternatively, the first storage elements 532C may be connected to the first logic circuit of the first layer L1. Moreover, the second storage elements 533C adjacent to the second layer L2 are connected to the second logic circuit to be used as a buffer memory storing image data, or the like. However, the connection relationship between pixels of the storage elements 532C and 533C, the first logic circuit, and the second logic circuit may be variously modified according to example embodiments.

Figure 16:
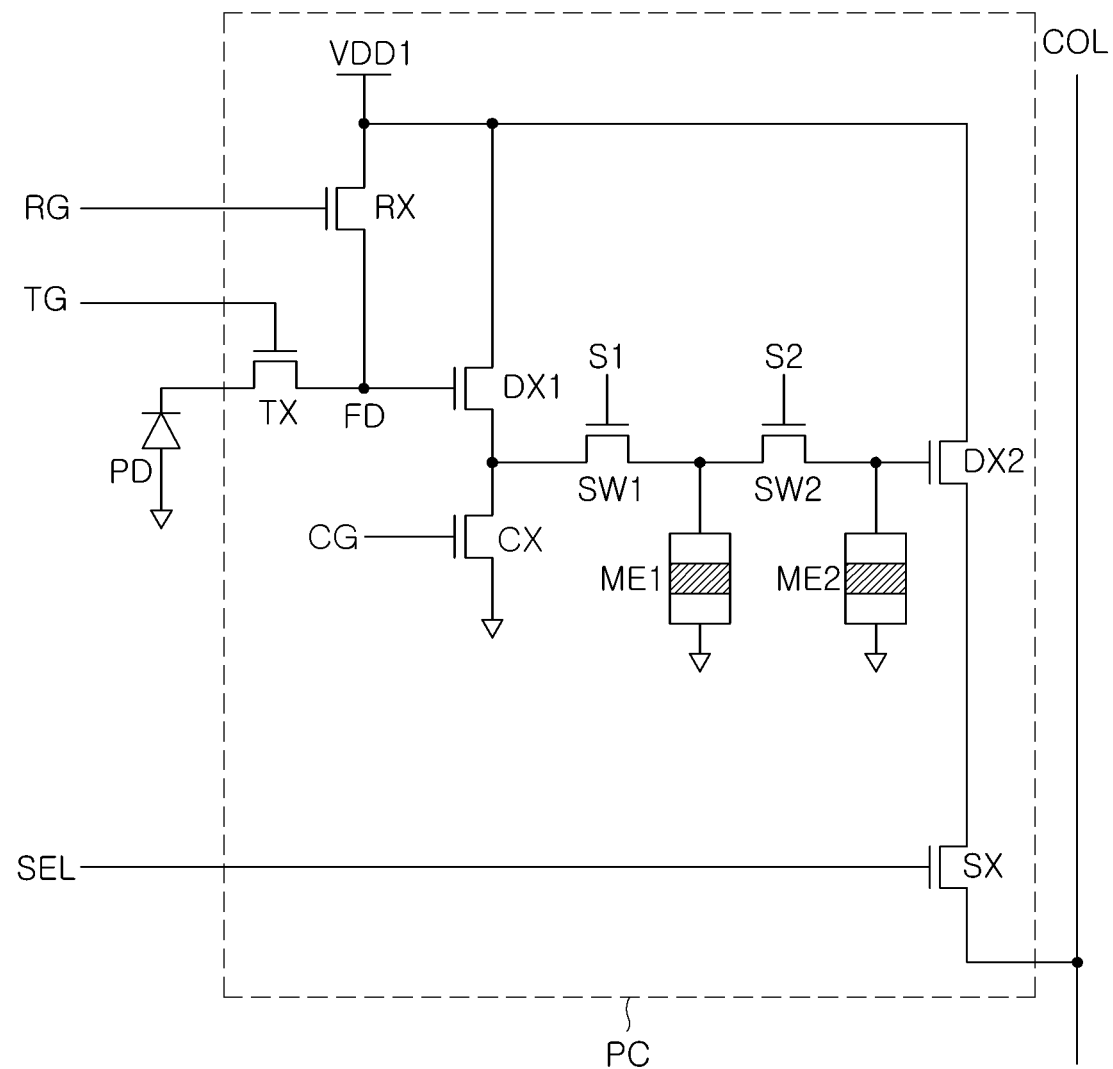
FIGS. 16 and 17 are diagrams illustrating storage elements included in an image sensor according to an example embodiment of the present disclosure.
Figure 17:
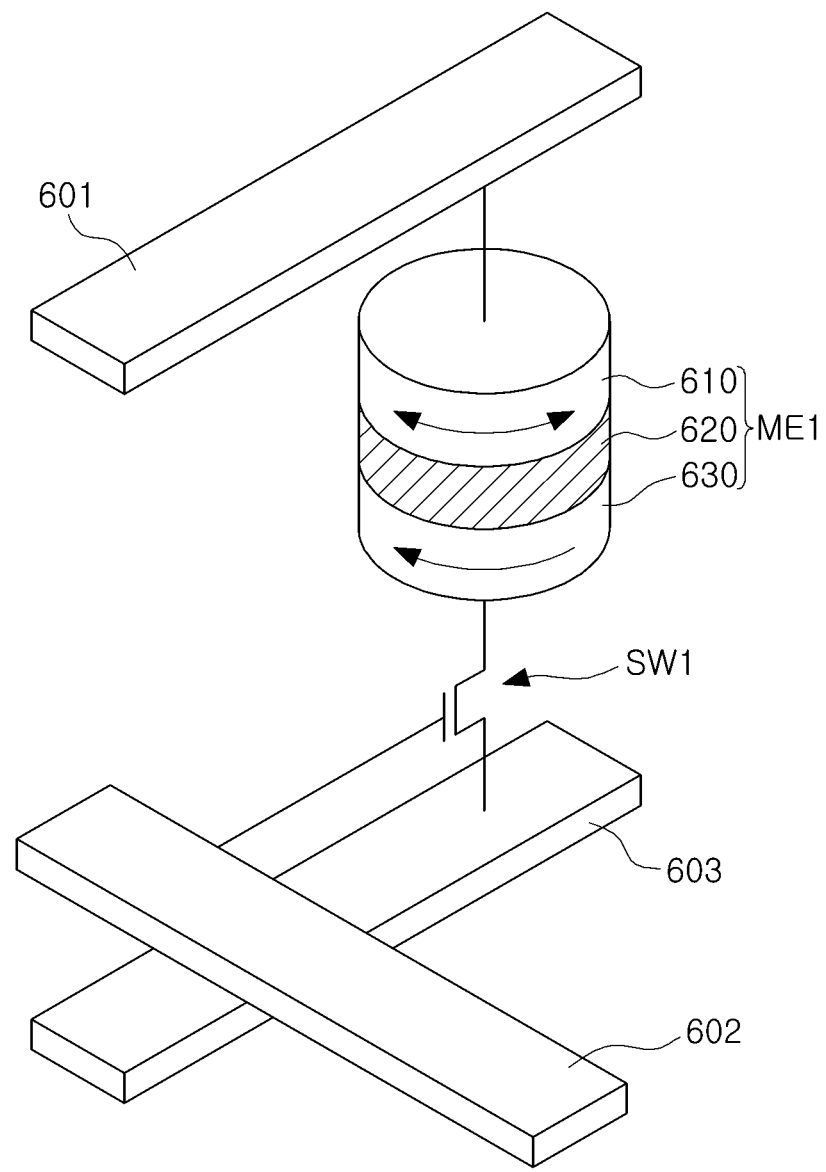

FIGS. 16 and 17 are diagrams illustrating storage elements included in an image sensor according to an example embodiment of the present disclosure.

First, referring to FIG. 16, in an example embodiment of the present disclosure, a pixel circuit PC may include a transfer transistor TX, a reset transistor RX, a first driving transistor DX1, a first switch element SW1, a second switch element SW2, a second driving transistor DX2, a select transistor SX, a current source transistor CX, and the like. Moreover, the pixel circuit PC may include at least one storage element ME1 and ME2. The operation of the pixel circuit PC may be similar to that described above with reference to FIG. 7. The pixel circuit PC may be operated in a global shutter method.

As at least one of the first switch element SW1 and a second switch element SW2 is turned-on, the first pixel signal, output by the first driving transistor DX1, may be stored in at least one of the first storage element ME1 and the second storage element ME2. The first storage element ME1 and the second storage element ME2 may be implemented as a Magnetic Tunneling Junction (MTJ) element. Hereinafter, the first storage element ME1 will be described together with reference to FIG. 17. The second storage element ME2 may be understood with reference to the following description of the first storage element ME1.

Referring to FIG. 17, the first storage element ME1 may include a MTJ element, and may include a free layer 610, a fixed layer 630, and a tunnel layer 620 disposed therebetween. A magnetization direction of the fixed layer 630 is fixed to not be changed, and a magnetization direction of a free layer 610 may be changed in the same or opposite direction as the fixed layer 630 depending on the conditions. In order to fix a magnetization direction of the fixed layer 630, an anti-ferromagnetic layer may be further included in the first storage element ME1.

In an example, in the first storage element ME1, the fixed layer 630 is connected to the first switch element SW1, and the free layer 610 may be connected to the first metal wiring 601. The first metal wiring 601 may be a wiring, to which a predetermined reference voltage (for example, a ground voltage) is input. The first switch element SW1 may be connected to the second metal wiring 602 and the third metal wiring 603. Referring to a circuit diagram of FIG. 16, it may be understood that a first control signal S1 is input through the second metal wiring 602, and the third metal wiring 603 is connected to an output terminal of the first driving transistor DX1.

The magnetization direction of the free layer 610 may be determined by a current or a voltage input by the first switch element SW1 turned-on by the first control signal S1, that is, a current or a voltage by a pixel signal output by the first driving transistor DX1. In an example, when a current flows from the free layer 610 to the fixed layer 630 by the first pixel signal, the magnetization direction of the free layer 610 may be the same as the fixed layer 630. Moreover, when a current flows from the fixed layer 630 to the free layer 610 by the first pixel signal, the magnetization direction of the free layer 610 may be changed in a direction opposite to the fixed layer 630.

Meanwhile, according to example embodiments of the present disclosure, the storage elements ME1 and/or ME2 of the pixel circuit PC may be provided by elements other than MTJ elements. In an example, the storage elements ME1 and/or ME2 may be provided by a variable resistance element in which a phase is changed according to a temperature. For example, the storage elements ME1 and ME2 may be implemented using germanium(Ge)-antimony(Sb)-tellurium(Te) (GST) elements. Alternatively, the storage elements ME1 and/or ME2 may be implemented using a charge trap element, a storage element including an additional charge storage layer in which a charge could be trapped. In other words, the storage elements ME1 and/or ME2 may be interpreted as conceptually including all types of elements capable of storing data using a first pixel signal output by the first driving transistor DX1. Moreover, according to example embodiments, the storage elements ME1 and ME2, included in the pixel circuit PC, may be implemented by different elements.

Figure 18:
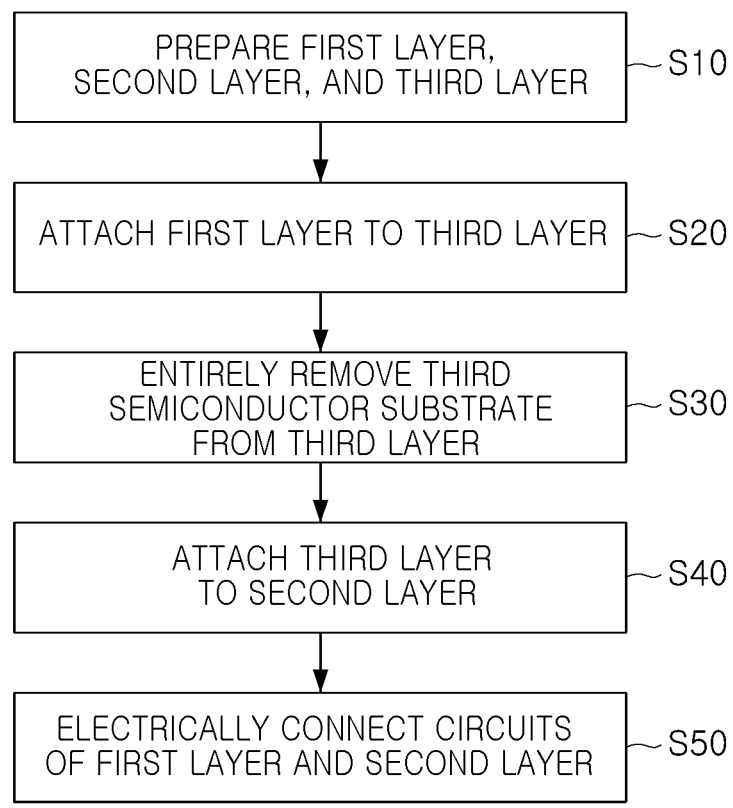
FIG. 18 is a flow diagram illustrating a method of manufacturing an image sensor according to an example embodiment of the present disclosure.
Figure 19:
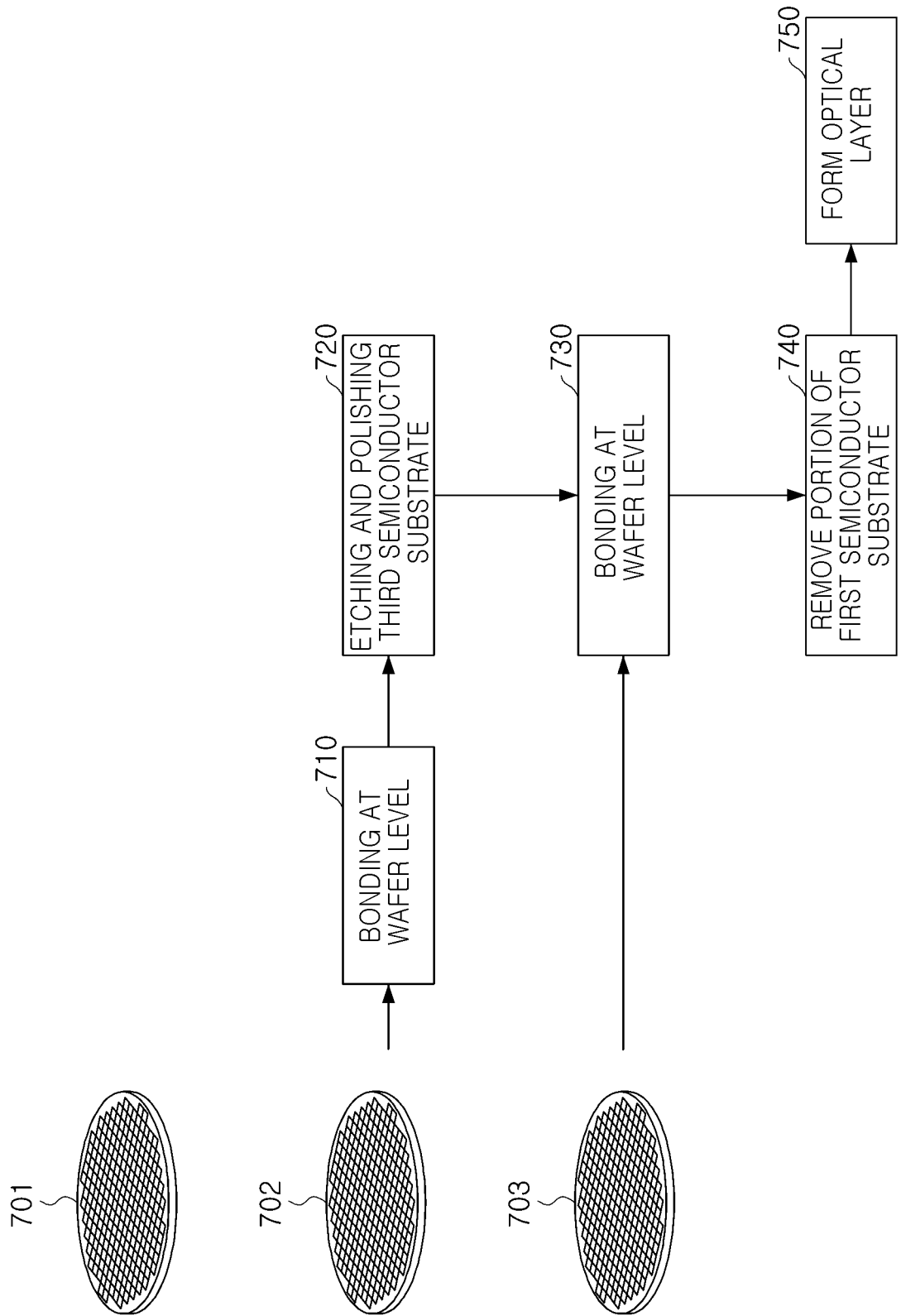
FIG. 19 is a diagram illustrating a method of manufacturing an image sensor according to an example embodiment of the present disclosure.

FIG. 18 is a flow diagram illustrating a method of manufacturing an image sensor according to an example embodiment of the present disclosure. Meanwhile, FIG. 19 is a diagram illustrating a method of manufacturing an image sensor according to an example embodiment of the present disclosure. Hereinafter, a method of manufacturing an image sensor will be described with reference to FIGS. 18 and 19.

Referring to FIGS. 18 and 19, a method of manufacturing an image sensor according to an example embodiment of the present disclosure may begin with preparing a first layer 701, a second layer 702, and a third layer 703 (S10). Each of the first layer 701, the second layer 702, and the third layer 703 may be a separate wafer.

In an example, the first layer 701 may include a first semiconductor substrate and pixels formed on the first semiconductor substrate, and a first logic circuit for driving pixels may be included in the first layer 701 according to example embodiments. The second layer 702 may include a second semiconductor substrate and a second logic circuit formed on the second semiconductor substrate, and a first logic circuit for driving pixels may be included in the second layer 702 according to example embodiments. The third layer 703 may include storage elements such as a MIM capacitor, a MOS capacitor, a MTJ element, a GST element, a charge trap element, and the like. Each of the first, second, and third semiconductor substrates may be different from one another (e.g., a separate wafer).

When the first to third layers 701 to 703 are prepared, the first layer 701 and the third layer 703 could be attached to each other (S20). The first layer 701 and the third layer 703 may be bonded to each other at a wafer level (710). In other words, at a wafer level, a level before a laser scribing process is performed on the first layer 701 and the third layer 703 to be separated into semiconductor chips, the first layer 701 and the third layer 703 may be attached to each other. The third layer 703 is vertically inverted to be attached to the first layer 701. Thus, when the first layer 701 and the third layer 703 are attached to each other, the first semiconductor substrate and the third semiconductor substrate may be exposed below and above, respectively. In an example, in a process of attaching the first layer 701 to the third layer 703, metal wirings of the first layer 701 and metal wirings of the third layer 703 may be connected to each other using a Cu—Cu bonding method.

When the first layer 701 and the third layer 703 are attached to each other, the third semiconductor substrate may be entirely removed from the third layer 703 (S30). In an example embodiment, the third semiconductor substrate may be entirely removed using an etching process and a Chemical Mechanical Polishing (CMP) process (720). The third semiconductor substrate is entirely removed, a semiconductor substrate, for example, a silicon wafer, is not provided in the third layer 703. In addition, at the preparing of the third layer 703, an insulating layer, formed on the third semiconductor substrate, may be exposed externally.

When the third semiconductor substrate is removed, the third layer 703 and the second layer 702 may be attached to each other (S40). Thus, the first, second, and third layers 701, 702, and 703 may be combined into one. The second layer 702 may be bonded to the third layer 703 at a wafer level (730), and, in a similar manner to S20, the second layer 702 may be vertically inverted and attached to the third layer 703. When the second layer 702 is attached to the third layer 703, the first logic circuit of the first layer 701 and the second logic circuit of the second layer 702 may be electrically connected to each other (S50). Moreover, according to example embodiments of the present disclosure, at least a portion of the second logic circuit of the second layer 702 may be electrically connected to storage elements of the third layer 703 by a Cu—Cu bonding method.

When the second layer 702 is attached to an upper portion of the third layer 703, a portion of the first semiconductor substrate may be removed (740). When a portion of the first semiconductor substrate is removed by a CMP process, an optical layer may be formed on one surface of the first semiconductor substrate, exposed externally (750). The optical layer may include a color filter, a microlens, a light blocking layer, and the like.

FIGS. 20 to 27 are diagrams illustrating a method of manufacturing an image sensor according to an example embodiment of the present disclosure.

Figure 20:
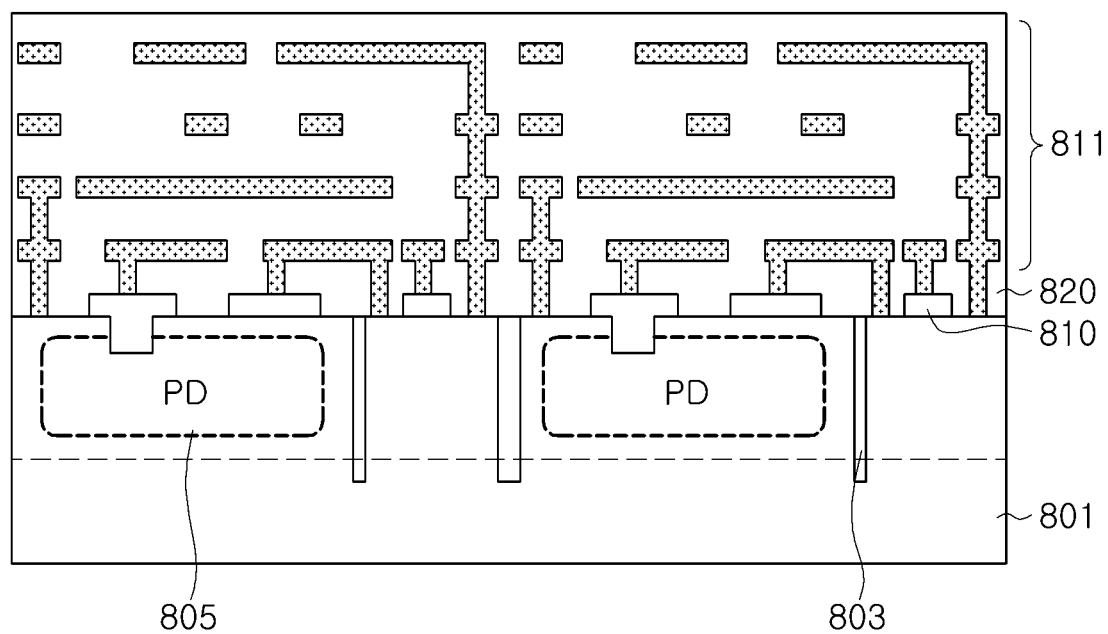
FIGS. 20 to 27 are diagrams illustrating a method of manufacturing an image sensor according to an example embodiment of the present disclosure.

Referring to FIG. 20, a first layer L1 may be prepared to manufacture an image sensor. The first layer L1 includes a first semiconductor substrate 801, and pixels may be disposed in the first semiconductor substrate 801. The pixels may be disposed in a first region of the first semiconductor substrate 801, and a first logic circuit for driving pixels may be disposed around the first region.

A photodiode 805 and a vertical separation membrane 803 may be formed inside the first semiconductor substrate 801. In an example embodiment illustrated in FIG. 20, it is illustrated that the vertical separation membrane 803 is formed to be deeper than the photodiode 805, but it is only an example and is not necessarily limited thereto. Transistors 810 and metal wirings 811, providing a pixel circuit, may be formed in one surface of the first semiconductor substrate 801. The transistors 810 and the metal wirings 811 may be in or covered by the first insulating layer 820.

Figure 21:
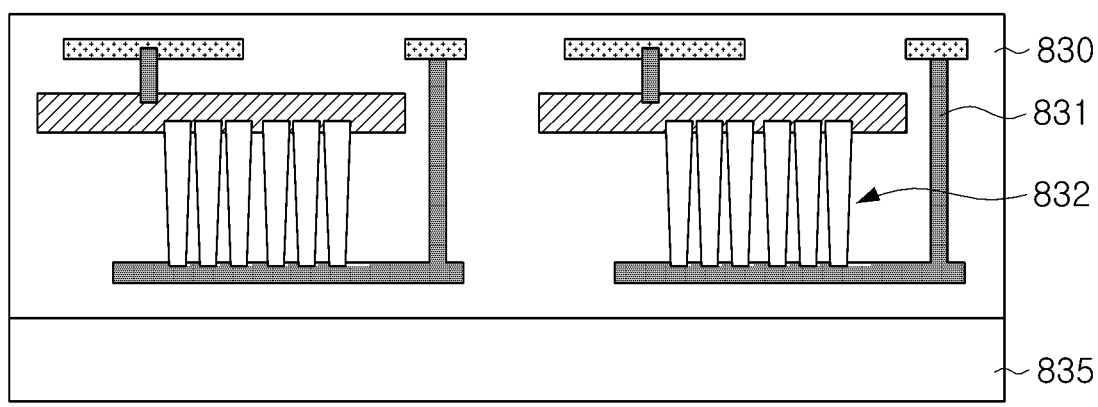

Referring to FIG. 21, a third layer L3 may be prepared to manufacture an image sensor. The third layer L3 includes a third semiconductor substrate 835, and metal wirings 831 and storage elements 832, connected to the metal wirings 831, may be formed in an upper portion of the third semiconductor substrate 835. The metal wirings 831 and the storage elements 832 may be in or covered by a third insulating layer 830 formed on the third semiconductor substrate 835. The storage elements 832 may be implemented as a capacitor, a MTJ element, a GST element, a charge trap element, and the like.

In an example embodiment of the present disclosure, a first layer L1 including pixels is formed in the first semiconductor substrate 801, while a third layer L3 including the storage elements 832 may be formed in a third semiconductor substrate 835, different from the first semiconductor substrate 801. Thus, when the storage devices 832 are capacitors, a process for formation of a dielectric film may be performed at a high temperature, and a leakage current of the capacitors may be significantly reduced. Moreover, the metal wirings 811 of the first layer L1 may be formed of a metal having low resistivity and high reflectance without material limitation, for example, copper.

Figure 22:
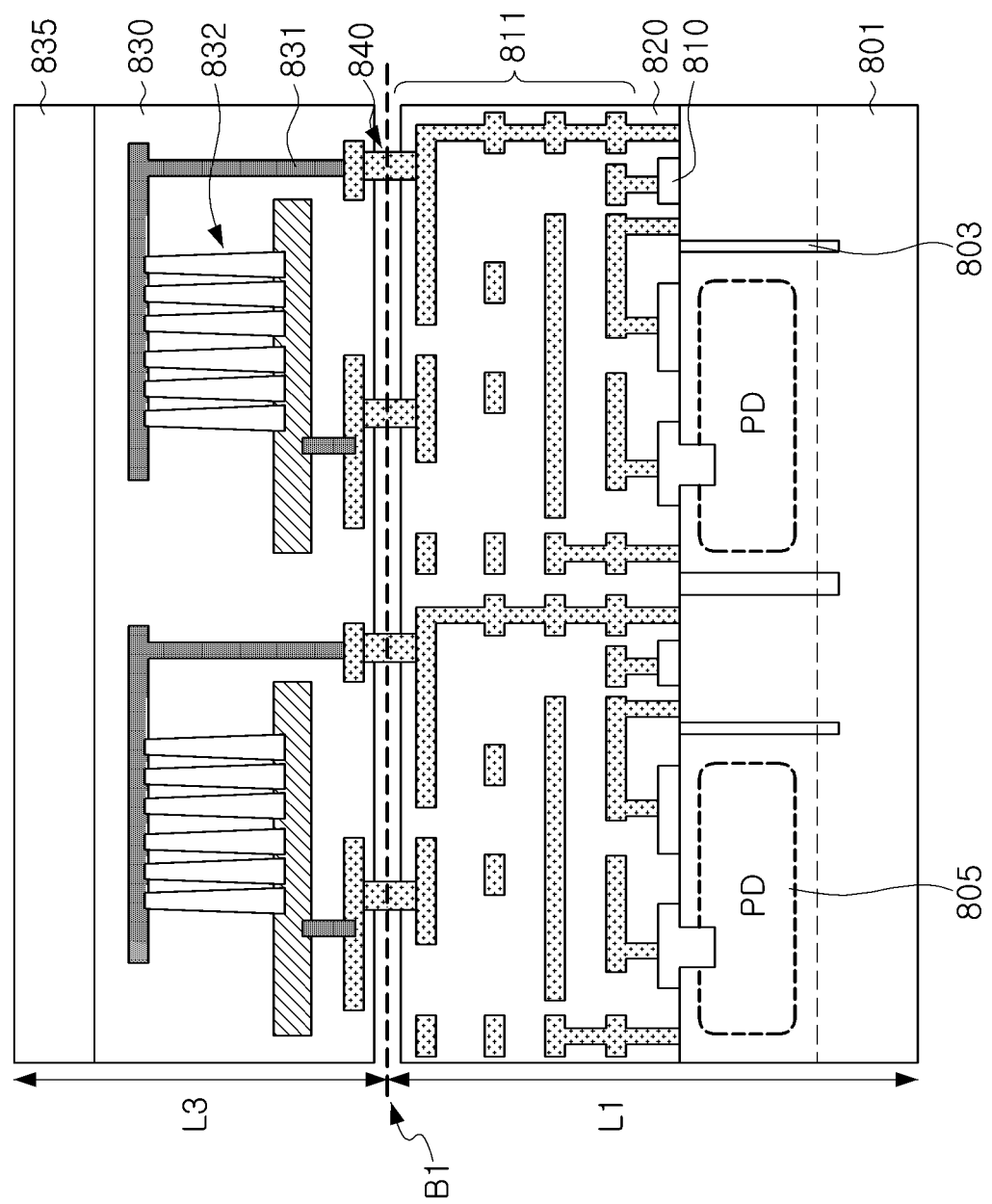

Next, referring to FIG. 22, the first layer L1 and the third layer L3 may be attached to each other. In an example, the third layer L3 is vertically inverted and is attached to an upper portion of the first layer L1, and thus, an upper surface of the first insulating layer 820 may face or oppose the third insulating layer 830. In an example embodiment illustrated in FIG. 22, the first layer L1 and the third layer L3 may be attached to each other by a Cu—Cu bonding method using the connection wirings 840 connecting the metal wirings 811 of the first layer L1 to the metal wirings 831 of the third layer L3. However, according to example embodiments, an additional adhesive layer may be disposed at a boundary B1 between the first layer L1 and the third layer L3.

Figure 23:
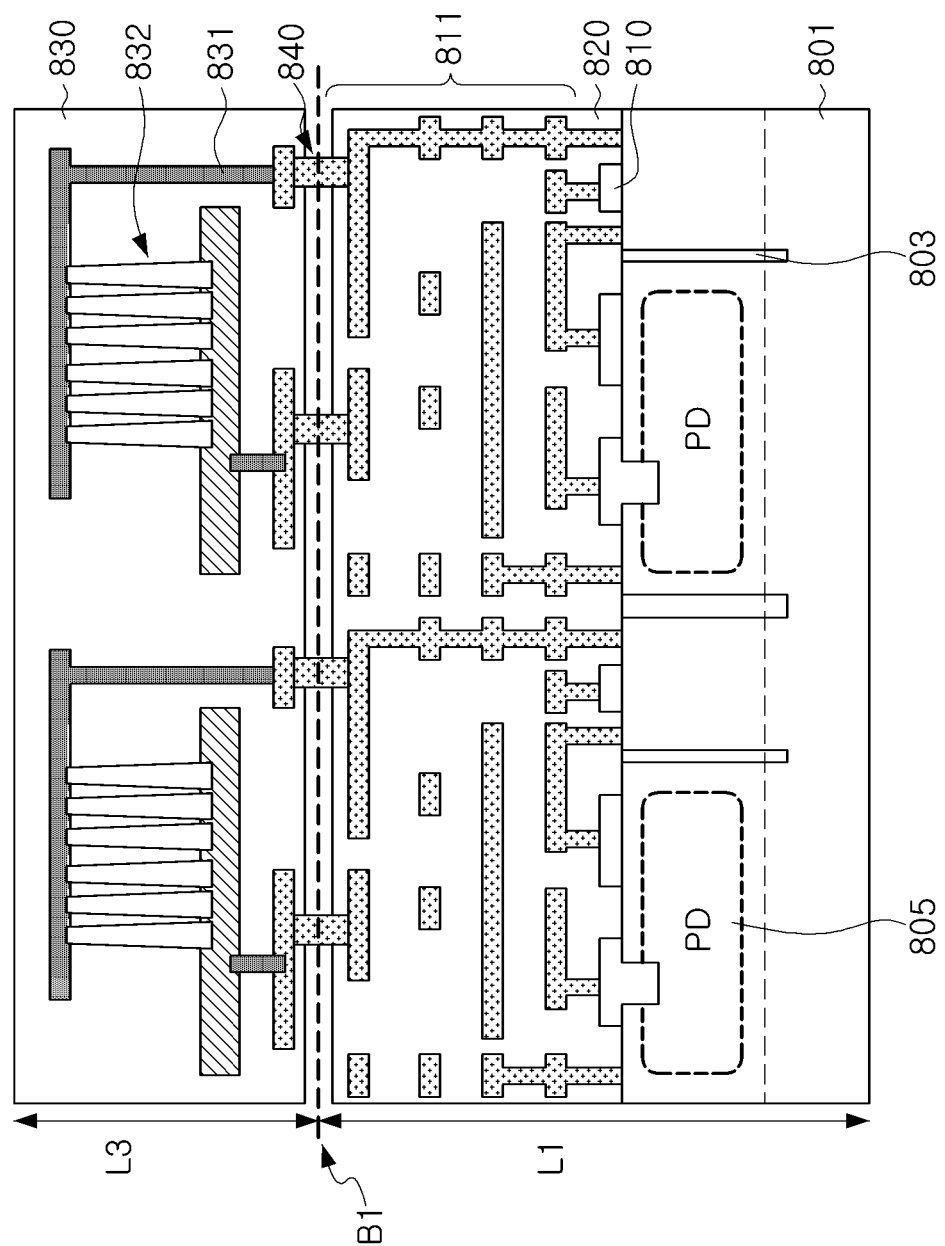

Referring to FIG. 23, while the first layer L1 and the third layer L3 are attached to each other, the third semiconductor substrate 835 may be entirely removed. As the third semiconductor substrate 835 is entirely removed, the third insulating layer 830 may be exposed externally.

Figure 24:
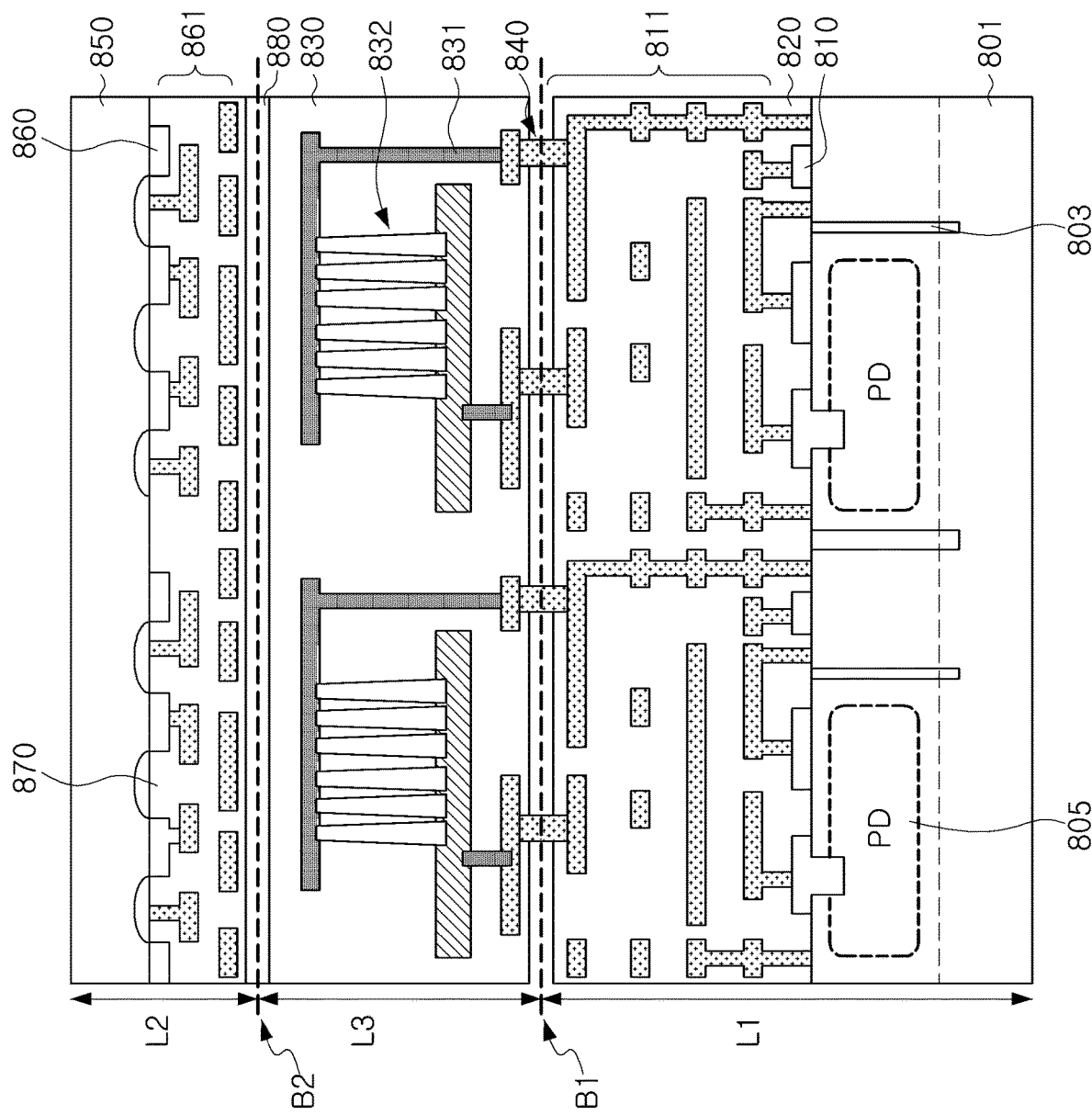
Figure 25:
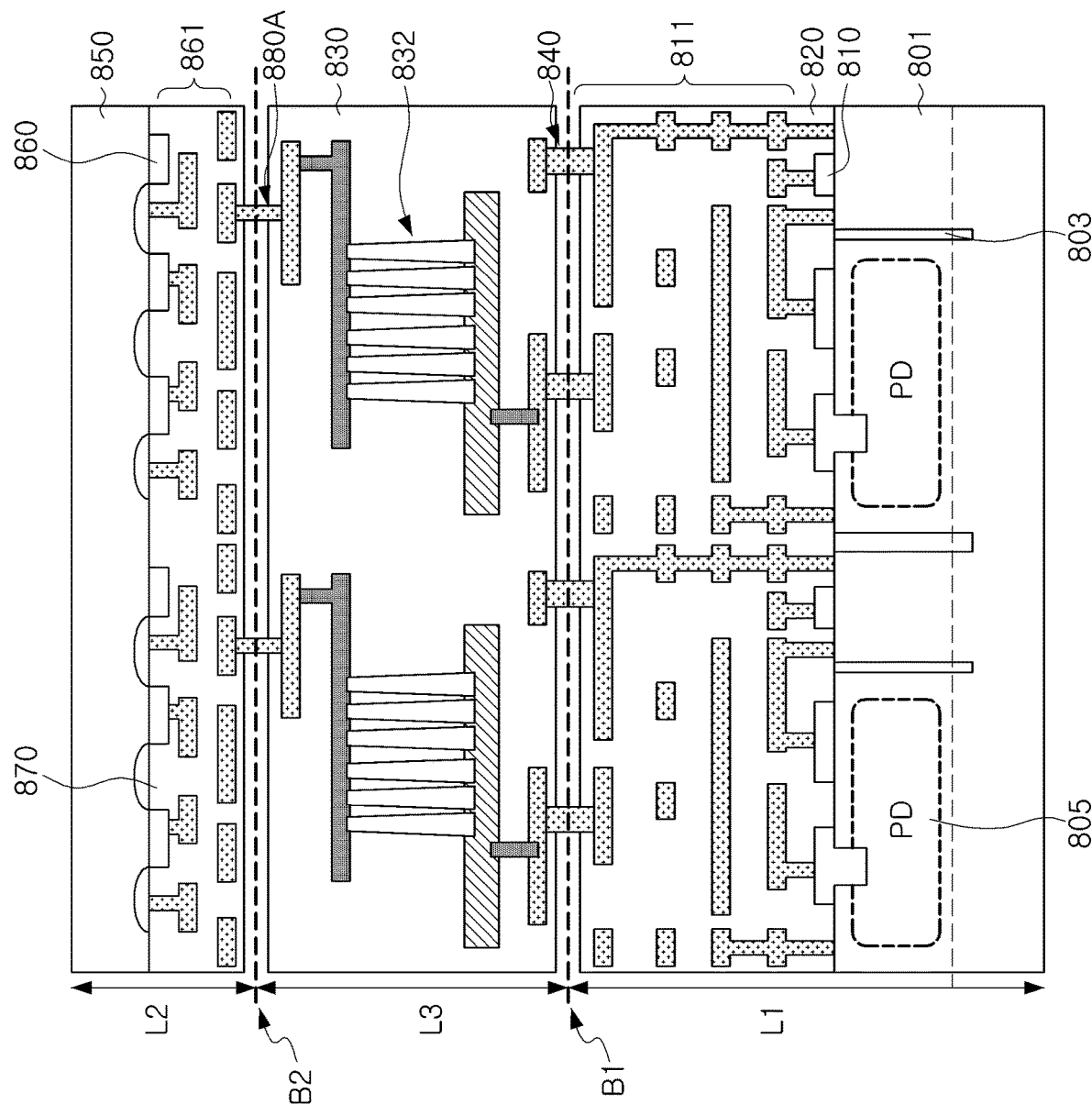

When the third semiconductor substrate 835 is entirely removed, as illustrated in FIG. 24, the second layer L2 may be attached to the third insulating layer 830. The second layer L2 may be vertically inverted and attached in a similar manner to the third layer L3, and thus, the second semiconductor substrate 850 may be located relatively above the second insulating layer 870. In an example embodiment illustrated in FIG. 24, the second layer L2 and the third layer L3 may be attached to each other by an additional adhesive layer 880 along boundary B2. Alternatively, as illustrated in FIG. 25, the second layer L2 and the third layer L3 may be attached by the connection wirings 880A providing Cu—Cu bonding, e.g., without an adhesive layer.

The second layer L2 may include pixels and a second logic circuit for driving the first logic circuit. The second logic circuit may include a power circuit, an input/output interface, an image signal processor, and the like. In the second layer L2, the circuit elements 860 and the metal wirings 861, for providing the second logic circuit, may be in or covered by the second insulating layer 870.

In order to connect the second logic circuit of the second layer L2 to the first logic circuit of the first layer L1, logic vias may be formed in an operation before the second layer L2 is attached. As described previously with reference to FIGS. 12 and 23, logic vias for connecting the first logic circuit to the second logic circuit may pass through the third layer L3.

In an example embodiment of the present disclosure, before the logic vias are formed, the third semiconductor substrate 835, included in the third layer L3, may be entirely removed using an etching process, a CMP process, or the like. The logic vias only pass through layers, formed of an insulating material, to connect the first logic circuit to the second logic circuit, without passing through a substrate including a semiconductor material. Thus, difficulties in forming logic vias may be reduced, which may reduce time and cost required for the process.

Figure 26:
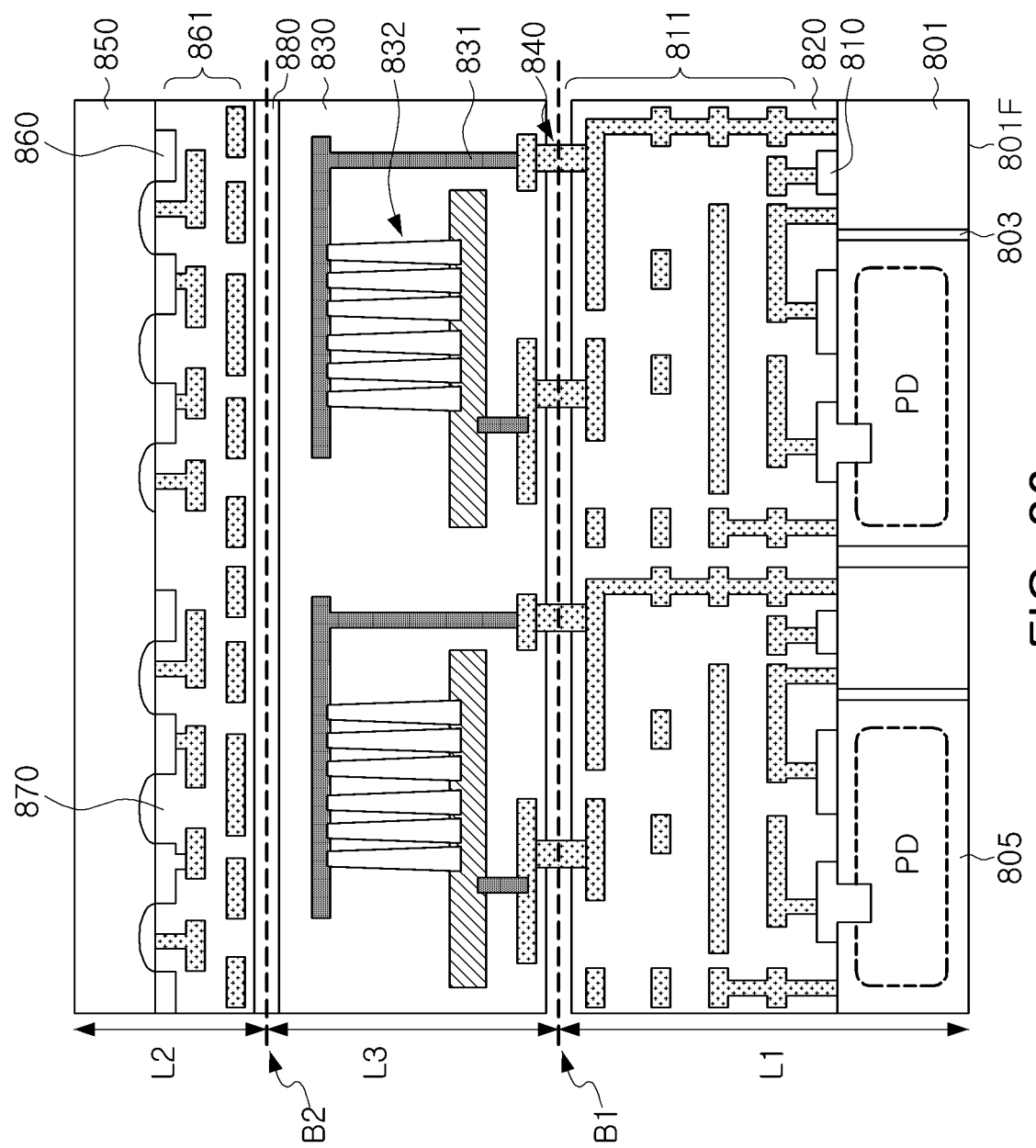

Referring to FIG. 26, a portion of the first semiconductor substrate 801 may be removed. As the first semiconductor substrate 801 is removed, the photodiode 805 may be located close to one surface 801F of the first semiconductor substrate 801. A portion of the first semiconductor substrate 801 may be removed using an etching process and/or a CMP process.

Figure 27:
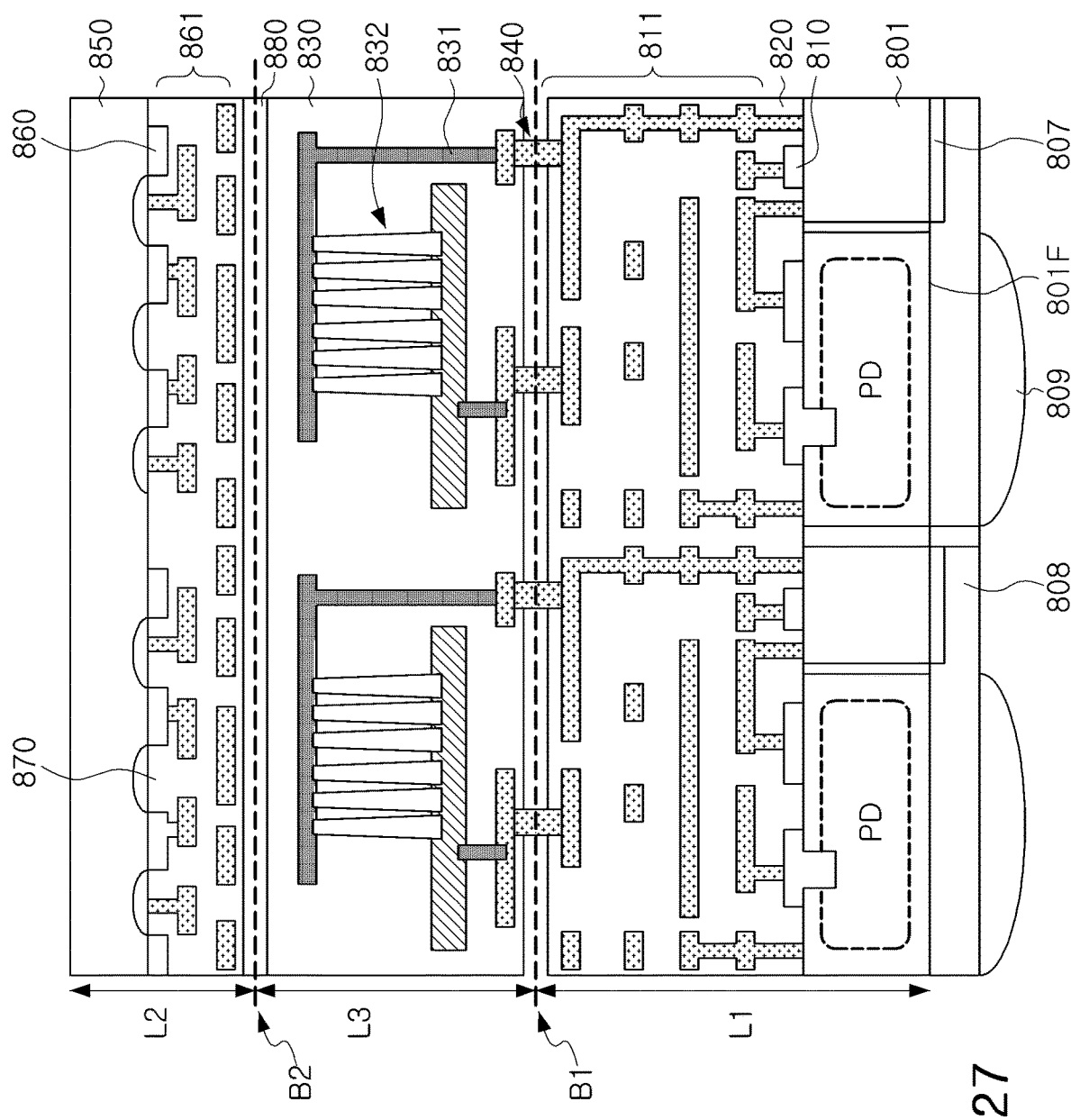

Next, referring to FIG. 27, an optical layer may be formed on one surface 801F of the first semiconductor substrate 801. The optical layer may include a light blocking layer 807, a color filter 808, a microlens 809, and the like. According to example embodiments, a buffer layer may be further formed between the color filter 808 and the first semiconductor substrate 801, and/or between the color filter 808 and the microlens 809.

In an example embodiment illustrated in FIG. 27, the color filter 808 covers the light blocking layer 807, and the microlens 809 may be formed to not overlap the light blocking layer 807. However, according to example embodiments, the color filter 808 is formed first on one surface 801F of the first semiconductor substrate 801, and the light blocking layer 807 and the microlens 809 may be formed on the color filter 808.

Figure 28:
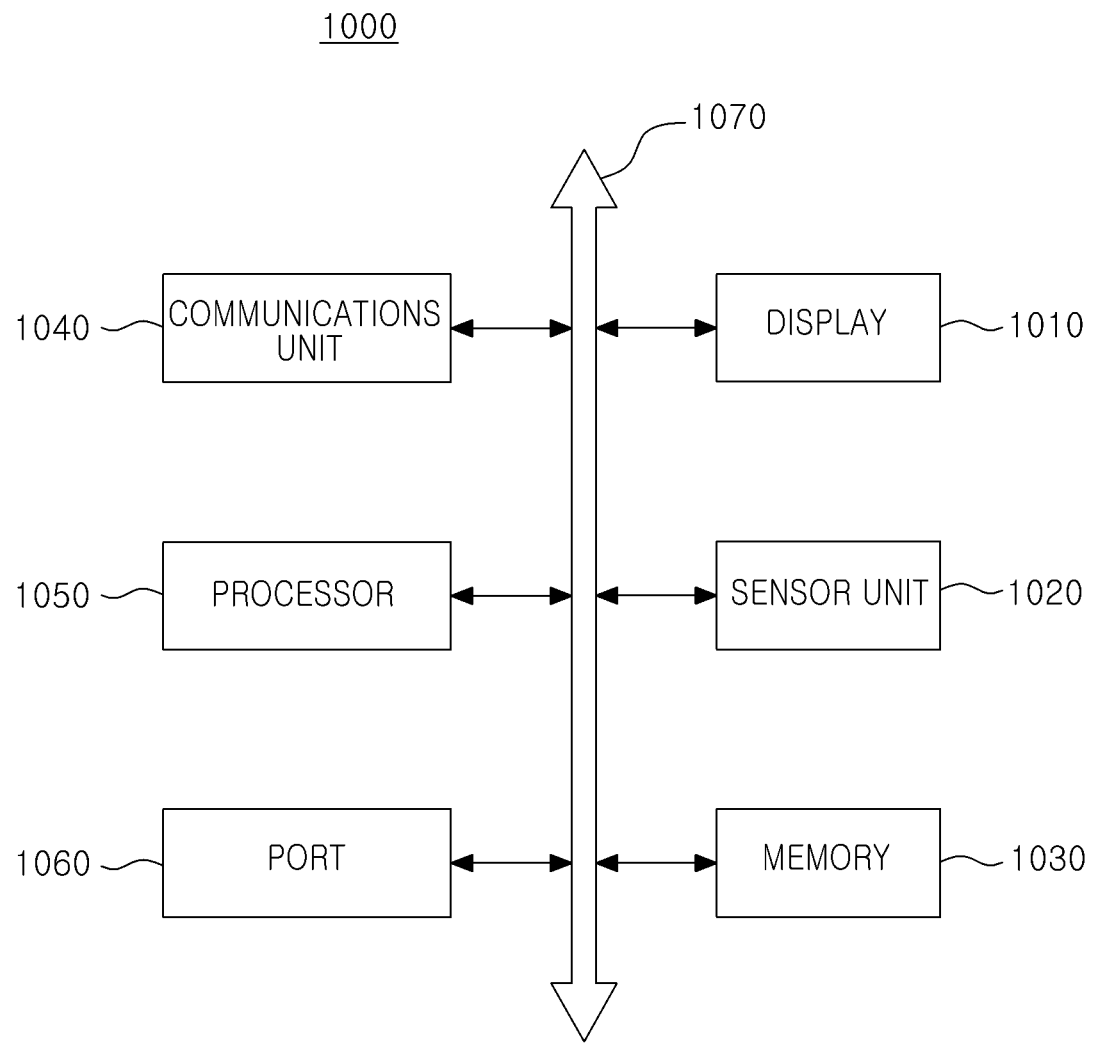
FIG. 28 is a schematic block diagram illustrating an electronic device including an image sensor according to an example embodiment of the present disclosure.

FIG. 28 is a schematic block diagram illustrating an electronic device including an image sensor according to an example embodiment of the present disclosure.

An electronic device 1000 according to an example embodiment illustrated in FIG. 28 includes a display 1010, a sensor unit 1020, a memory 1030, a communications unit 1040, a processor 1050, and a port 1060. The electronic device 1000 may further include a power supply, an input and output device, and the like. Among components illustrated in FIG. 28, the port 1060 may be provided for the electronic device 1000 to communicate with a video card, a sound card, a memory card, a universal serial bus (USB) device, and the like. The electronic device 1000 may be a smartphone, a tablet PC, a smart wearable device, and the like, as well as a desktop computer and a laptop computer according to the related art.

The processor 1050 may be configured to perform a certain operation, a command, a task, and the like. The processor 1050 may be a central processing unit (CPU), a microprocessor unit (MCU), a System on Chip (SoC), or the like, and may communicate with the display 1010, the sensor unit 1020, the memory 1030, the communications unit 1040, and other devices connected to the port 1060 through a bus 1070.

The memory 1030 may be a storage medium storing data for an operation of the electronic device 1000, or multimedia data. The memory 1030 may include a volatile memory such as a random access memory (RAM) or a non-volatile memory such as a flash memory. In addition, the memory 1030 may include at least one of a solid state drive (SSD), a hard disk drive (HDD), and an optical disk drive (ODD), as a storage element.

The sensor unit 1020 may include an image sensor, a global positioning system (GPS) sensor, an acoustic sensor, and the like. Moreover, the electronic device 1000 may include two or more image sensors. In this case, at least one of characteristics such as a pixel count, an angle of view, and an aperture value of two or more image sensors may have different values. In an example embodiment illustrated in FIG. 28, an image sensor, included in the sensor unit 1020, may be an image sensor according to various example embodiments described previously with reference to FIGS. 1 to 27.

As set forth above, according to example embodiments of the present inventive concept, a pixel array, a logic circuit, and storage elements are formed on additional or respective layers, and the layers are stacked to manufacture an image sensor. In a layer disposed in the middle of layers stacked on each other, a semiconductor substrate may be entirely removed. Thus, a process of manufacturing an image sensor may be simplified, and an image sensor may provide various functions using storage elements.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

When an element is referred to as being "on" or "connected to" another element, it can be directly on or connected to the other element, or intervening elements may be present. In contrast, when an element is referred to as being "directly on" or "directly connected to" another element, there are no intervening elements present. The term "and/or" includes any and all combinations of one or more of the associated listed items.

While example embodiments have been shown and described above, it will be apparent to those skilled in the art that modifications and variations could be made without departing from the scope of the present disclosure, as defined by the appended claims.

What is claimed is:

1. An image sensor, comprising:
a first layer comprising pixels in a pixel array, and a first logic circuit configured to control the pixel array, each of the pixels comprising:
at least one photodiode configured to generate a charge in response to light; and
a pixel circuit configured to generate a pixel signal corresponding to the charge;
a second layer comprising a second logic circuit electrically connected to the pixel array and the first logic circuit, wherein the second layer is on the first layer; and
a third layer comprising storage elements electrically connected to at least one of the pixels or the first logic circuit, and further comprising an insulating layer including the storage elements therein,
wherein a lower surface of the insulating layer is directly attached to an upper portion of the first layer, and an upper surface of the insulating layer is directly attached to a lower portion of the second layer, and wherein the first layer and the second layer are free of a semiconductor substrate therebetween.

2. The image sensor of claim 1, wherein the first layer comprises a first semiconductor substrate, the second layer comprises a second semiconductor substrate, and the third layer is free of through silicon vias (TSVs).

3. The image sensor of claim 1, wherein the pixel circuit of the each of the pixels is connected to at least one of the storage elements, and
each of the pixels is connected to a different storage element among the storage elements.

4. The image sensor of claim 3, wherein the pixels are configured to be simultaneously activated to generate the charges, and the storage elements are configured to be programmed by the pixel signals.

5. The image sensor of claim 4, wherein the storage elements are configured to sequentially output the pixel signals to the first logic circuit.

6. The image sensor of claim 4, wherein the pixel circuit of the each of the pixels comprises a switch element connected between the at least one of the storage elements and the at least one photodiode.

7. The image sensor of claim 1, wherein the storage elements are configured to store first image data, the first logic circuit is configured to generate the first image data by controlling the pixels to be active during a first time, and
the first logic circuit is configured to generate a resulting image using the first image data, and second image data, acquired by controlling the pixels to be active during a second time different from the first time.

8. The image sensor of claim 1, wherein the storage elements comprise at least one of a Metal-Insulator-Metal (MIM) capacitor, a charge trap element, a Magnetic Tunnel Junction (MTJ) element, or a germanium (Ge)-antimony (Sb)-tellurium (Te) (GST) element.

9. The image sensor of claim 1, wherein the pixels and the storage elements are connected by copper-to-copper (Cu—Cu) bonding at a boundary between the first layer and the third layer.

10. The image sensor of claim 1, wherein the upper surface of the insulating layer is attached to the lower portion of the second layer by an adhesive layer that is between the second layer and the third layer.

11. The image sensor of claim 1, wherein a second region of the second layer, in which the second logic circuit is disposed, corresponds to a first region of the first layer, in which the pixel array is disposed, and
the second logic circuit is electrically connected to at least one of the pixels or the storage elements.

12. The image sensor of claim 11, wherein the second logic circuit and the storage elements are connected by copper-to-copper (Cu—Cu) bonding at a boundary between the second layer and the third layer, and wherein the boundary is located in an upper portion of the pixel array.

13. The image sensor of claim 11, wherein the second logic circuit comprises analog-to-digital converters that are connected to the pixels through the storage elements and are configured to convert the pixel signals into digital pixel signals.

14. The image sensor of claim 13, wherein the analog-to-digital converters are connected to the pixels, respectively, and are configured to output the digital pixel signals through column lines.

15. The image sensor of claim 1, wherein the first layer further comprises metal wirings connected to the pixel circuit of the each of the pixels, and wherein the metal wirings comprise copper (Cu).

16. An image sensor, comprising:
a pixel array comprising pixels in a first semiconductor substrate, each of the pixels comprising:
  a photodiode configured to generate a charge in response to light; and
  a pixel circuit configured to generate a pixel voltage based on the charge;
a first logic circuit comprising first elements in the first semiconductor substrate, wherein the first logic circuit is configured to control the pixels and is in a first insulating layer on the first semiconductor substrate;
a second logic circuit comprising second elements in a second semiconductor substrate that is different from the first semiconductor substrate, wherein the second logic circuit is configured to drive the pixel array and the first logic circuit and is in a second insulating layer on the second semiconductor substrate; and
capacitors between the first insulating layer and the second insulating layer, wherein the capacitors are in a third insulating layer that is different from the first insulating layer and the second insulating layer, and are connected to at least one of the pixel array or the first logic circuit,
wherein a lower surface of the third insulating layer is directly attached to an upper portion of the first insulating layer, and an upper surface of the third insulating layer is directly attached to a lower portion of the second insulating layer, and
wherein the first insulating layer and the second insulating layer are free of a semiconductor substrate therebetween.

17. The image sensor of claim 16, wherein a lower surface of the third insulating layer faces an upper surface of the first insulating layer, and wherein an upper surface of the third insulating layer faces a lower surface of the second insulating layer.

18. The image sensor of claim 16, wherein the pixel circuit of each of the pixels comprises:
a first driving transistor configured to output a first pixel signal based on the charge generated by the photodiode;
a switch element connected to an output terminal of the first driving transistor; and
a second driving transistor connected to the switch element and configured to output a second pixel signal.

19. An image sensor, comprising:
a first layer comprising a first semiconductor substrate, a pixel array in a first region of the first semiconductor substrate, and a first logic circuit in a second region around the first region and configured to drive the pixel array;
a second layer stacked on the first layer in a direction perpendicular to an upper surface of the first semiconductor substrate, the second layer comprising a second semiconductor substrate, and a second logic circuit on the second semiconductor substrate;
a third layer between the first layer and the second layer and comprising storage elements and an insulating layer including the storage elements therein, wherein a lower surface of the insulating layer is directly attached to an upper portion of the first layer and an upper surface of the insulating layer is directly attached to a lower portion of the second layer; and
logic vias extending through the insulating layer of the third layer and connecting the first logic circuit to the second logic circuit, wherein the logic vias do not extend through a semiconductor material in the third layer.

20. The image sensor of claim 19, wherein a length of the logic vias is greater than a thickness of the third layer.

* * * * *